US012699317B2

(12) United States Patent
Kato

(10) Patent No.: US 12,699,317 B2
(45) Date of Patent: Aug. 4, 2026

(54) FILM FORMING METHOD, ARTICLE MANUFACTURING METHOD, SUPPLY DEVICE, FILM FORMING APPARATUS, AND SUBSTRATE

(71) Applicant: CANON KABUSHIKI KAISHA, Tokyo (JP)

(72) Inventor: Jun Kato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 450 days.

(21) Appl. No.: 18/180,949

(22) Filed: Mar. 9, 2023

(65) Prior Publication Data

US 2023/0221636 A1     Jul. 13, 2023

Related U.S. Application Data

(63) Continuation of application No. PCT/JP2021/032512, filed on Sep. 3, 2021.

(30) Foreign Application Priority Data

Sep. 30, 2020     (JP) ................................. 2020-166105

(51) Int. Cl.
*G03F 7/00*          (2006.01)
*B05C 5/02*          (2006.01)
(Continued)

(52) U.S. Cl.
CPC .......... *G03F 7/0002* (2013.01); *B05C 5/0291* (2013.01); *B29C 59/022* (2013.01); (Continued)

(58) Field of Classification Search
CPC ... G03F 7/0002; B05C 5/0291; B29C 59/022; B29C 59/023; B29C 59/026; B29C 59/027
See application file for complete search history.

(56) References Cited

U.S. PATENT DOCUMENTS 8,394,282 B2     3/2013  Panga et al.
9,415,418 B2     8/2016  Sreenivasan et al.
(Continued)

FOREIGN PATENT DOCUMENTS

JP          2003230860 A          8/2003
JP          2005532576 A         10/2005
(Continued)

OTHER PUBLICATIONS

International Search Report issued in Intl. Appln. No. PCT/JP2021/032512 mailed Nov. 22, 2021. English translation provided.
(Continued)

*Primary Examiner* — JaMel M Nelson
(74) *Attorney, Agent, or Firm* — ROSSI, KIMMS & McDOWELL LLP

(57) ABSTRACT

The present invention provides a film forming method of forming a film on a substrate, wherein the substrate includes a region including a first concave portion and a second concave portion, the first concave portion has a width larger than that of the second concave portion, and the film forming method includes: selectively supplying a first material into the first concave portion and molding the first material; and supplying a second material onto the region and molding the second material, such that the second concave portion is filled with the second material and a planarization film of the second material is formed over all of the region.

19 Claims, 10 Drawing Sheets

Dense REGION   Open REGION   TRENCH REGION (BATHTUB PORTION)

WAFER WITH UNDERLYING PATTERN FORMED

UNEVEN SHAPE OF RESIST SURFACE

UNEVEN SHAPE OF WAFER UNDERLYING SURFACE

(51) Int. Cl.
   B29C 59/02      (2006.01)
   *B29L 31/34*      (2006.01)
   *H10P 95/00*      (2026.01)

(52) U.S. Cl.
   CPC ..... B29C 59/026 (2013.01); *B29L 2031/3406*
   (2013.01); *H10P 95/08* (2026.01)

(56)               References Cited

U.S. PATENT DOCUMENTS

| | | | |
|---|---|---|---|
| 2005/0170093 A1* | 8/2005 | Chung ................ | H10P 72/0448 |
| | | | 257/E21.174 |
| 2009/0130594 A1 | 5/2009 | Takei et al. | |
| 2010/0012622 A1* | 1/2010 | Panga ................... | G03F 7/0002 |
| | | | 216/52 |
| 2015/0048050 A1* | 2/2015 | Sreenivasan ............. | B05D 1/40 |
| | | | 427/508 |
| 2016/0351409 A1* | 12/2016 | Takahata ............. | H01L 21/0274 |
| 2019/0270857 A1* | 9/2019 | Wu .......................... | C09D 4/06 |
| 2021/0098319 A1* | 4/2021 | Lan ......................... | C04B 41/90 |

FOREIGN PATENT DOCUMENTS

| | | | |
|---|---|---|---|
| JP | 2007033302 A | 2/2007 |
| JP | 2009213953 A | 9/2009 |
| JP | 2011171038 A | 9/2011 |
| JP | 2016219679 A | 12/2016 |
| JP | 2019051507 A | 4/2019 |
| JP | 2019140101 A | 8/2019 |
| JP | 2020027918 A | 2/2020 |
| JP | 2020136347 A | 8/2020 |
| WO | 03073164 A2 | 9/2003 |

OTHER PUBLICATIONS

Written Opinion issued in Intl. Appln. No. PCT/JP2021/032512 mailed Nov. 22, 2021.

Office Action issued in Chinese Appln. No. 202180066711.7, mailed Mar. 18, 2024. English translation provided.

* cited by examiner

F I G. 1A
Dense REGION    Open REGION    TRENCH REGION
(BATHTUB PORTION)
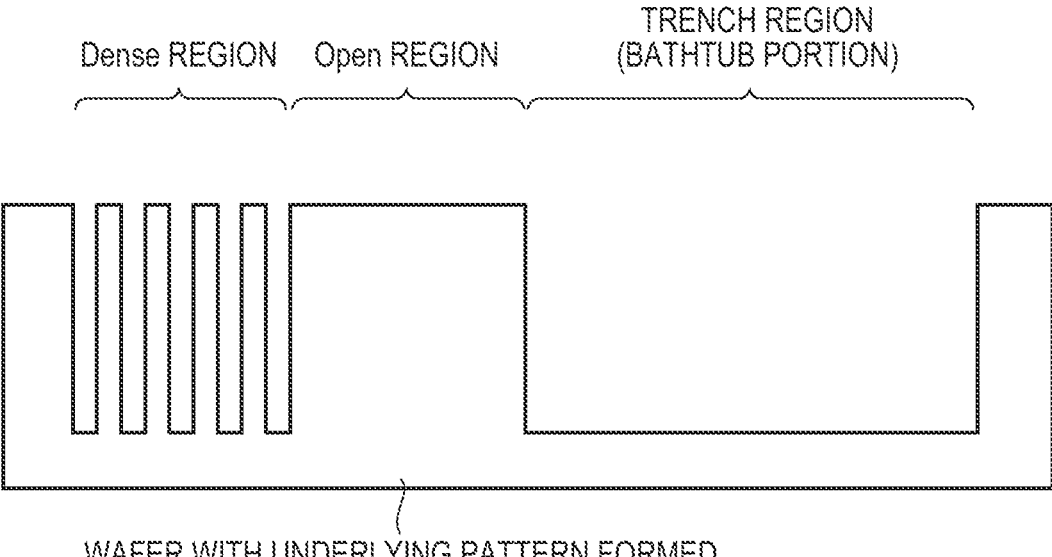
WAFER WITH UNDERLYING PATTERN FORMED
F I G. 1B
UNEVEN SHAPE OF RESIST SURFACE
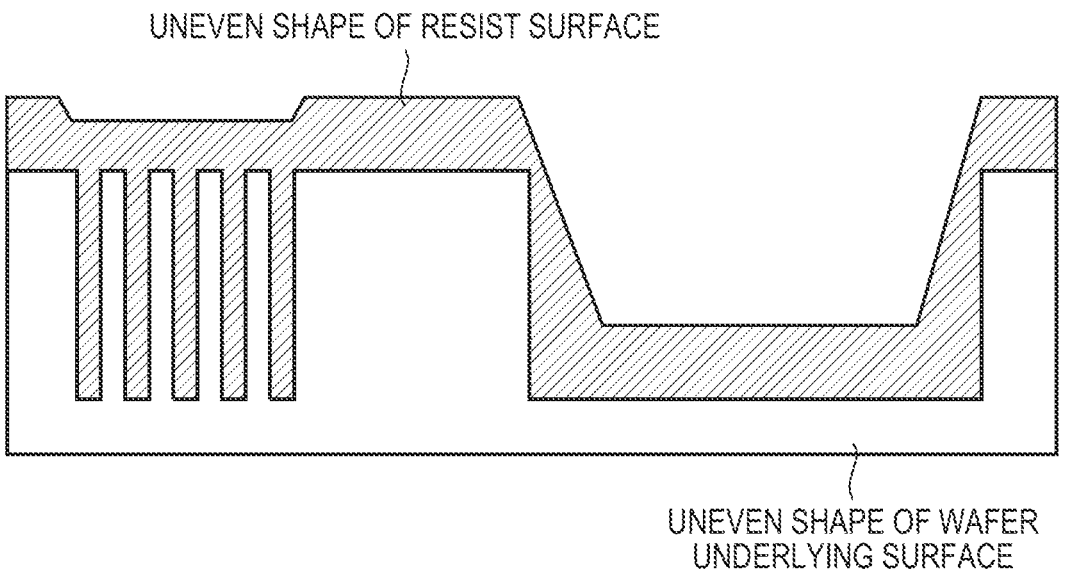
UNEVEN SHAPE OF WAFER
UNDERLYING SURFACE

F I G. 2
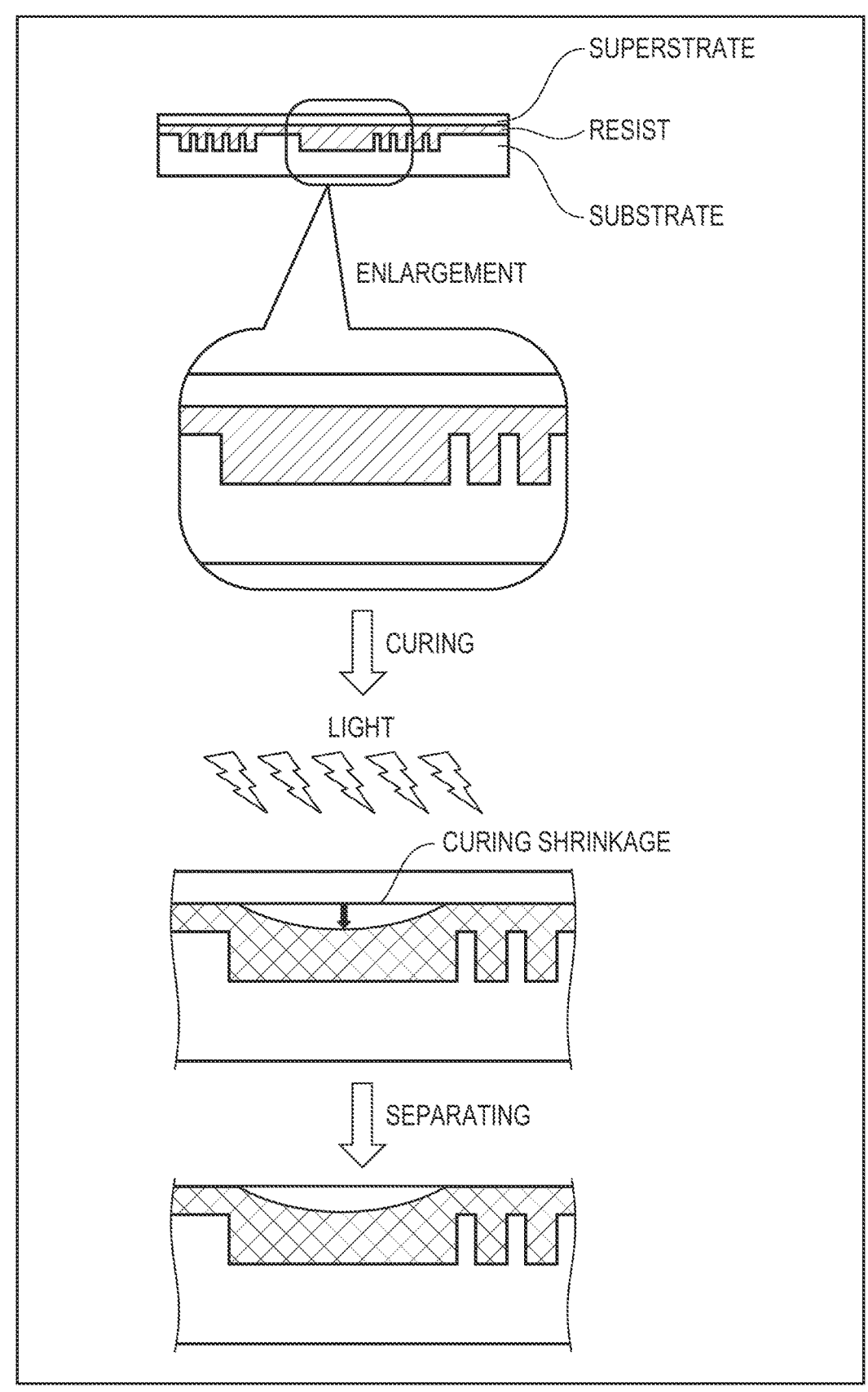

F I G. 3
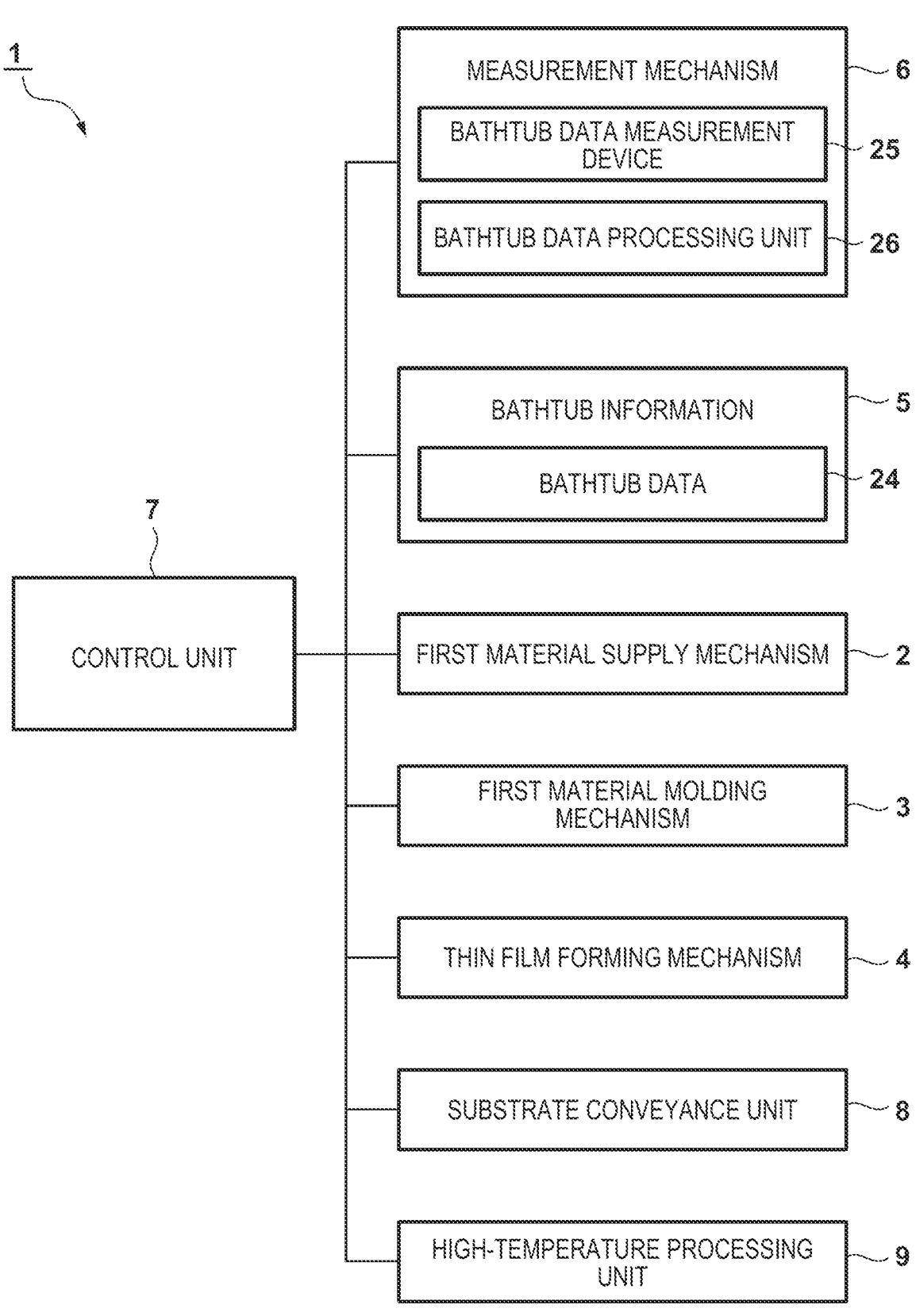

F I G. 5
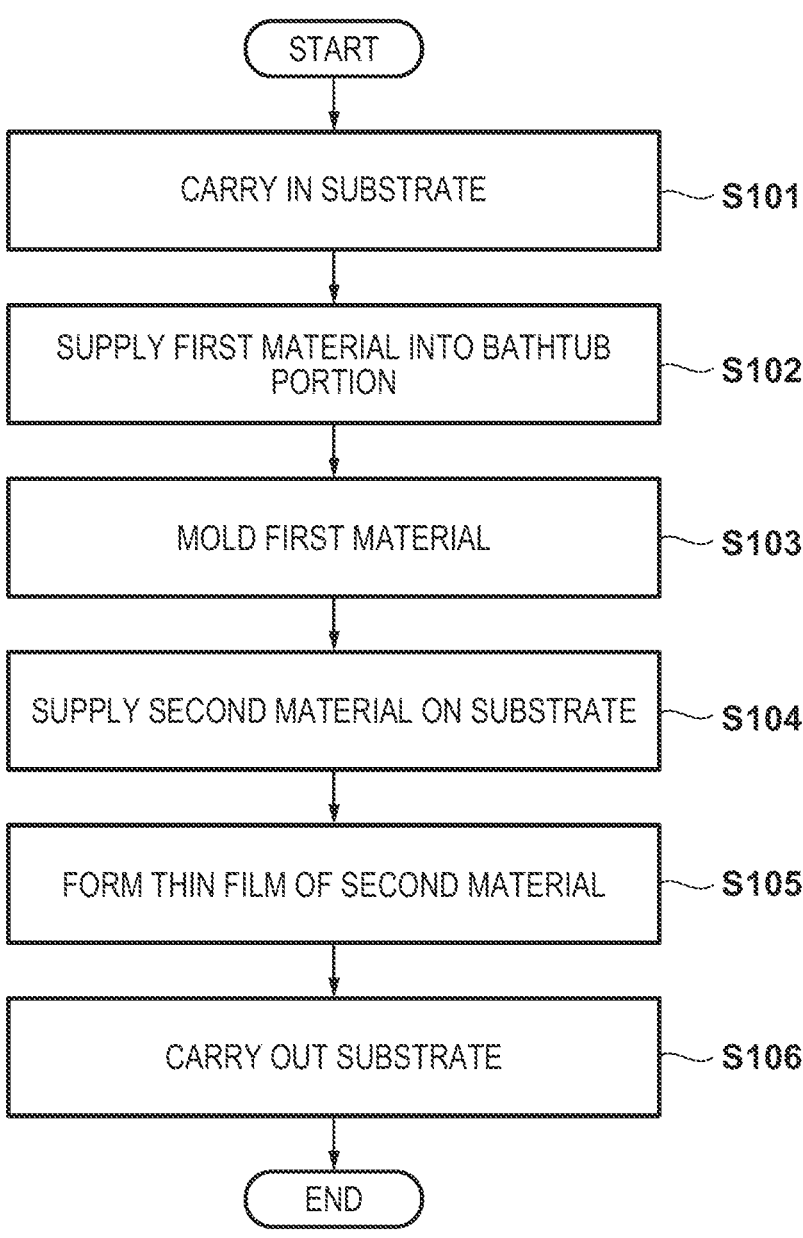

1

FILM FORMING METHOD, ARTICLE MANUFACTURING METHOD, SUPPLY DEVICE, FILM FORMING APPARATUS, AND SUBSTRATE

CROSS-REFERENCE TO RELATED APPLICATIONS

This application is a Continuation of International Patent Application No. PCT/JP2021/032512, filed Sep. 3, 2021, which claims the benefit of Japanese Patent Application No. 2020-166105, filed Sep. 30, 2020, both of which are hereby incorporated by reference herein in their entirety.

BACKGROUND OF THE INVENTION

Field of the Invention

The present invention relates to a film forming method, an article manufacturing method, a supply device, a film forming apparatus, and a substrate.

Background Art

A technique of forming a flat film on the surface of a substrate such as a wafer is one of important techniques in a semiconductor manufacturing process that needs multilayered wiring. PTL 1 proposes a technique of forming a planarization film on a substrate with a plurality of processing portions of uneven shapes provided on its surface. PTL 2 proposes a method of forming a planarization film on a substrate with topography. In the method of each of PTLs 1 and 2, a resist is dropped on a substrate, the resist is cured in a state in which a blank template is pressed against the resist, and the blank template is then separated from the resist, thereby forming a flat resist film on the substrate. Also, PTL 2 discloses changing the volume of the material (resist) to be supplied onto the substrate in accordance with the variation of the topography of the substrate.

Depending on a substrate, a relatively large concave portion (to be sometimes referred to as a bathtub portion hereinafter) is formed on the surface. In the bathtub portion, a step difference/recess that is larger than in the other portions readily occurs in a film formed on the substrate. That is, on the substrate with the bathtub portion, it may be difficult to accurately form a film (for example, a planarization film) on the surface.

CITATION LIST

Patent Literature

PTL 1: Japanese Patent Laid-Open No. 2005-532576
PTL 2: Japanese Patent Laid-Open No. 2016-219679

SUMMARY OF THE INVENTION

The present invention provides, for example, a technique advantageous in accurately forming a film on a substrate.

According to one aspect of the present invention, there is provided A film forming method of forming a film on a substrate, wherein the substrate includes a region including a first concave portion and a second concave portion, the first concave portion has a width larger than that of the second concave portion, and the film forming method comprises: selectively supplying a first material into the first concave portion and molding the first material; and supplying a second material onto the region and molding the second material, such that the second concave portion is filled with the second material and a planarization film of the second material is formed over all of the region.

Further features of the present invention will become apparent from the following description of exemplary embodiments with reference to the attached drawings.

BRIEF DESCRIPTION OF THE DRAWINGS

FIG. 1A is a view for explaining a problem of a conventional technique.

FIG. 1B is a view for explaining a problem of a conventional technique.

FIG. 2 is a view for explaining a problem of a conventional technique.

FIG. 3 is a block diagram showing an example of the configuration of a film forming apparatus according to the present invention.

FIG. 5 is a flowchart showing a film forming method according to the present invention.

DESCRIPTION OF THE EMBODIMENTS

Figure 4A:
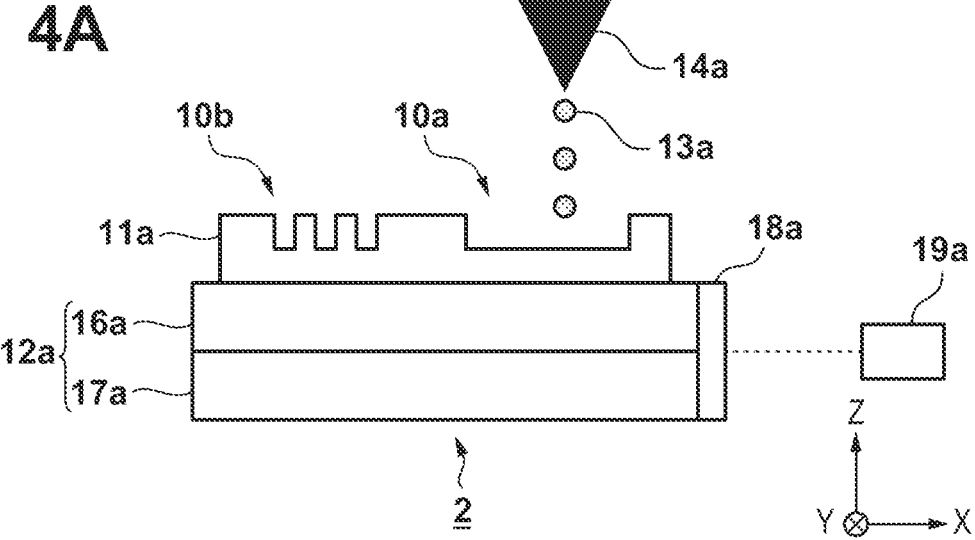
FIG. 4A is a schematic view showing an example of the configuration of the first material supply mechanism of the film forming apparatus according to the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A technique of forming a flat film on the surface of a substrate such as a wafer is one of important techniques in a semiconductor manufacturing process that needs multilayered wiring. For example, if a wiring layer is directly stacked on a wiring layer on a substrate surface with an uneven pattern such as wirings, a distortion corresponding to the unevenness of the underlying layer is generated in the stacked structure, and a problem such as a connection failure between the upper and lower layers occurs. Also, in a substrate with an uneven pattern having a nonuniform width diameter/depth, the nonuniformity increases as material layers are repetitively stacked on the uneven pattern. Hence, the surface of the stacked film is more difficult to planarize.

For this reason, the substrate surface needs to be planarized every time one layer of wiring (a wiring layer or a material layer) is formed.

If planarity is improved, various advantages can be obtained. For example, in ArF immersion (ArFi) lithography, the focal depth (DOF), the critical dimensions (CD), and the critical dimension uniformity (CDU) can be improved. In extreme ultraviolet (EUV) lithography, the position accuracy of a pattern and the DOF can be improved. In nanoimprint lithography (NIL) for forming a fine uneven pattern of a curable composition by transferring a fine uneven pattern of a template surface to a substrate, the resist filling property to the template or the CD and the CDU of the transfer pattern can be improved.

While the techniques of microfabrication and multilayering are advancing to improve the performance of semiconductor devices and MEMS, demands for processing fine patterns on the order of several nm to several tens of nm have increased. Simultaneously, a more advanced planarization technique is needed to obtain an unevenness accuracy of several nm.

The most common planarization technique in the semiconductor industry is chemical mechanical polishing (CMP). However, the CMP that is a technique developed mainly aiming at processing a hard material such as a metal or a dielectric substance is difficult to apply to a soft material such as an organic material, and strict process control is necessary. Additionally, on a substrate including a concave portion wider than several μm, dishing (a phenomenon that a portion is excessively polished as compared to its periphery) occurs in that portion, and the planarity inevitably lowers.

As another planarization technique, the method proposed in PTL 1 described above is known. PTL 1 discloses a substrate planarization method of dropping a resist on a substrate with a plurality of processing portions of uneven shapes provided on its surface, pressing the resist against a blank template, curing the resist, and then releasing the blank template from the resist.

In the semiconductor manufacturing process, depending on a substrate, a bathtub portion (first concave portion) that is a concave portion wider than other portions often exists on the same substrate as a fine uneven pattern (second concave portion) of several nm to several tens of nm. In many conventional techniques of planarizing a pattern substrate, however, a material is uniformly supplied to form a film. Hence, since a step difference/recess occurs because of the shortage of the material in the bathtub portion, it is difficult to planarize up to the unevenness accuracy of several nm needed to process a fine uneven pattern of several nm to several tens of nm.

For example, an underlying pattern for a device has an unevenness distribution in an exposure shot in accordance with a function to be formed, and the periods of the uneven pattern in the X and Y directions have widths of several ten to several hundred μm depending on the design. For example, in a memory device, the average pattern height derived from the pattern design generally changes in a memory cell portion in a chip, in a scribe line serving as the boundary between a chip and a chip, and in the boundary portion between a memory peripheral circuit and a memory cell area.

FIGS. 1A and 1B are views schematically showing a cross section of a substrate to which a resist is applied using a spin coater. FIG. 1A shows the cross section of the substrate before the resist is applied, and FIG. 1B shows the cross section of the substrate after the resist is applied. On a substrate (wafer) with an underlying pattern formed, as an example, three types of regions including a dense region, an open region, and a trench region (also called a bathtub portion) sometimes exist, as shown in FIG. 1A. The dense region is a region where, for example, a plurality of grooves (second concave portions) of a fine pattern such as lines and spaces with a fine pitch are formed (engraved), and the open region is a region where no pattern is arranged at all. The trench region is a region where a groove (a bathtub portion or a first concave portion) having a large width diameter as compared to the dense region is formed. If a resist is spin-coated to such a wafer, as shown in FIG. 1B, since the resist surface substantially conforms to the shape of a thin film according to the average height of the wafer, a topography shape that reflects the unevenness of the wafer underlying surface with a long period is obtained. That is, it is difficult to do planarization at an unevenness accuracy of several nm.

PTL 2 described above discloses a substrate planarization method of dropping a resist on a substrate with a topography, pressing the resist against a blank template, curing the resist, and then releasing the blank template from the resist. PTL 2 discloses a step of changing, in accordance with variations of the topography of the substrate, the volume of a material to be discharged. After the material is supplied to portions other than the bathtub portion, brought into contact with a superstrate, and planarized, curing/separating is performed. For this reason, since the influence of a volume change caused by curing shrinkage (usually about 5% to 15%) of the organic material is larger in the bathtub portion than in the other portions, a step difference/recess that is larger than in the other portions occurs, and it may be impossible to do planarization at an unevenness accuracy of several nm (see FIG. 2). Embodiments of the present invention that enables accurate formation of a film (planarization film) on the surface of a substrate will be described below.

First Embodiment

[Film Forming Apparatus]

In the first embodiment, a film forming apparatus according to the present invention will be described. The film forming apparatus according to this embodiment is an apparatus that forms a film on a substrate, and can be configured to accurately form a thin film (planarization film) on a substrate whose surface shape has variations. For example, the substrate as the target to form a thin film has a region including a plurality of concave portions. Of the plurality of concave portions, at least one concave portion (first concave portion) is sometimes formed as a bathtub portion whose width and/or capacity is larger than another concave portion (second concave portion). The film forming apparatus according to this embodiment can be configured to accurately form a thin film (planarization film) over all of the region of the substrate including the plurality of concave portions. The film forming apparatus according to this embodiment can include, for example, a first material supply means for supplying a first material into a bathtub portion (first concave portion), a first material molding means for molding the first material, a second material supply means for supplying a second material onto the substrate, and a second material molding means for molding the second material. The second material molding means may be understood as a thin film forming means for forming a thin film (planarization film) of the second material on the substrate.

FIG. 3 is a view showing an example of the configuration of a film forming apparatus 1 according to this embodiment.

The film forming apparatus 1 can include a first material supply mechanism 2 (supply device) that is a means for supplying a first material to a bathtub portion, and a first material molding mechanism 3 (first molding apparatus) that is a means for molding the first material. Also, the film forming apparatus 1 can include a thin film forming mechanism 4 (second molding apparatus) that is a means for supplying a second material and is a means for forming a thin film (planarization film) of the second material. Note that in the example shown in FIG. 3, a control unit 7 (controller) common to the first material supply mechanism 2, the first material molding mechanism 3, and the thin film forming mechanism 4 is provided. However, the present invention is not limited to this, and a control unit may individually be provided for each mechanism. The control unit 7 can be formed by, for example, a computer including a CPU and a memory, and can comprehensively control processing performed by the film forming apparatus 1.

The first material supply mechanism 2 is a mechanism that selectively supplies a first material 13a to a bathtub portion 10a of a substrate 11a. The first material supply mechanism 2 can include, for example, a first substrate holding unit 12a capable of fixing/holding the substrate 11a and moving it, and a first material supply unit 14a that supplies the first material 13a to the bathtub portion 10a of the substrate 11a, as shown in FIG. 4A. Note that in the substrate 11a shown in FIG. 4A, a plurality of grooves 10b (second concave portions) formed as lines and spaces at a fine pitch are formed in addition to the bathtub portion 10a (first concave portion). Here, the plurality of grooves 10b (second concave portions) are not limited to the lines and spaces and may be grooves, holes, or the like around pillars.

The first substrate holding unit 12a can include a substrate chuck 16a that fixes/holds the substrate 11a, and a substrate driving mechanism 17a that controls the position of the substrate 11a concerning at least two axes in an x-axis direction and a y-axis direction on an XYZ coordinate system. Also, the first substrate holding unit 12a may include, on its side surfaces, a plurality of reference mirrors 18a corresponding to X, Y, Z, $\omega$x, $\omega$y, and $\omega$z directions. In this case, the first material supply mechanism 2 includes a plurality of laser interferometers 19a (length measurement devices) that irradiate the reference mirrors 18a with beams, thereby measuring the position of the first substrate holding unit 12a (that is, the position of the substrate 11a). The laser interferometers 19a measure the position of the first substrate holding unit 12a, and the control unit 7 executes positioning control of the substrate 11a (first substrate holding unit 12a) based on measurement values at this time. The first material supply mechanism 2 may measure the position of the first substrate holding unit 12a using an encoder in place of the reference mirrors 18a and the laser interferometers 19a. This makes it possible to align the substrate 11a with other portions and, for example, improve the alignment accuracy between the bathtub portion 10a of the substrate 11a and the first material supply unit 14a.

The first material supply unit 14a is a unit configured to supply the first material 13a into the bathtub portion 10a of the substrate 11a and can be formed as, for example, a discharge unit (discharger) that discharges the first material 13a to the substrate 11a. Based on bathtub information 5 about the position of the bathtub portion 10a, the control unit 7 controls the relative positions of the first material supply unit 14a and the substrate 11a such that the first material 13a discharged from the first material supply unit 14a (discharge unit) is selectively supplied into the bathtub portion 10a. Change/adjustment of the relative positions can be performed by, for example, the substrate driving mechanism 17a. Thus, a substrate 11b in which the first material 13a is supplied into the bathtub portion 10a can be obtained.

Here, the first material supply unit 14a can be configured to discharge (supply) the first material 13a as one or a plurality of droplets into the bathtub portion 10a of the substrate 11a. In this case, each droplet of the first material 13a discharged from the first material supply unit 14a preferably has a volume smaller than the capacity of the bathtub portion 10a such that the first material 13a is fitted in the bathtub portion 10a. For example, the volume of each droplet discharged from the first material supply unit 14a is preferably 2 pL or less. In addition, each droplet of the first material 13a discharged from the first material supply unit 14a preferably has a diameter smaller than the width diameter of the bathtub portion 10a such that the first material 13a is fitted in the bathtub portion 10a. For example, the width diameter (as an example, the width diameter of each droplet at the time of landing on the substrate) of each droplet discharged from the first material supply unit 14a is preferably 8 $\mu$m or less.

Also, the first material supply unit 14a is preferably formed by a dispenser including one or a plurality of nozzles capable of supplying (discharging) a droplet of a volume on a sub-femto liter or picoliter order. For example, the first material supply unit 14a can supply a micro droplet of the first material 13a onto the substrate using a supply method such as a piezoelectric method, a micro solenoid method, or an electrostatic discharge method. As an example, a dispenser available from Xaar, which can supply a droplet of a volume on a picoliter order using a piezoelectric method or a dispenser available from SIJ Technology, which can supply a droplet of a volume on a sub-femto liter order can be used as the first material supply unit 14a. The first material supply unit 14a may include a plurality of dispensers of the same type or different types. The first material 13a supplied by the first material supply unit 14a is not limited to a liquid if it is a material that the first material molding mechanism 3 can mold. An appropriate first material supply unit 14a can be provided in accordance with the state of the substance of the first material 13a. Also, the first material supply unit 14a may include a driving mechanism that controls the position of the first material supply unit 14a concerning at least two axes in the x-axis direction and the y-axis direction on the XYZ coordinate system. In this case, change/adjustment of the relative positions of the first material supply unit 14a and the substrate 11a may be performed by the driving mechanism of the first material supply unit 14a or both the driving mechanism of the first material supply unit 14a and the substrate driving mechanism 17a.

Figure 4B:
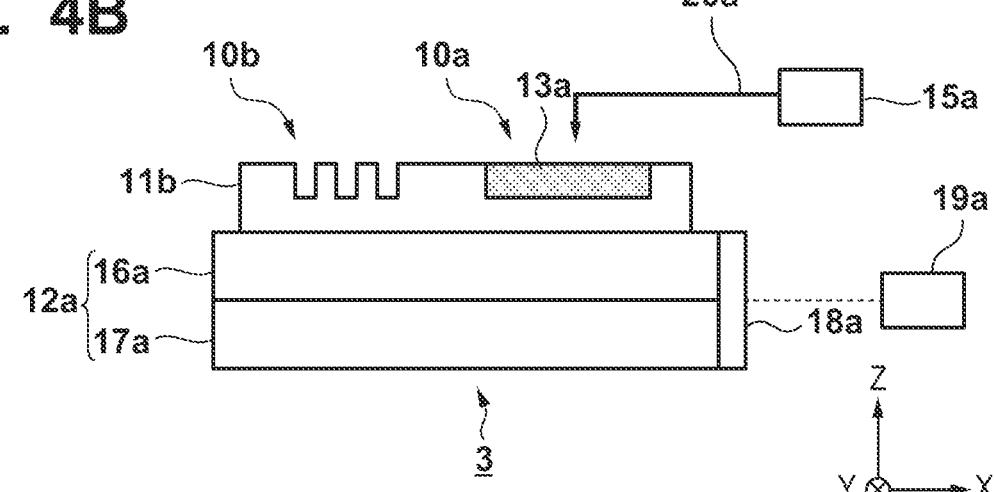
FIG. 4B is a schematic view showing an example of the configuration of the first material molding mechanism of the film forming apparatus according to the present invention.

The first material molding mechanism 3 is a mechanism that molds the first material 13a selectively supplied into the bathtub portion 10a by the first material supply mechanism 2, and can include, for example, a first energy source 15a, as shown in FIG. 4B. The first energy source 15a can supply, to the first material 13a, energy 20a for molding (for example, solidifying) the first material 13a supplied into the bathtub portion 10a. As the first energy source 15a, an electromagnetic wave source, a heat source, or the like can be used. That is, an electromagnetic wave, heat, or the like can be used as the energy 20a for molding the first material 13a. The electromagnetic wave is, for example, light such as a microwave, infrared rays, visible rays, or ultraviolet rays whose wavelength is selected from the range of 10 nm (inclusive) to 1 mm (inclusive). As the electromagnetic wave, radiation such as an electron beam or gamma rays can also be employed. As the first energy source 15a, for example, a high-pressure mercury lamp, a xenon lamp, a halogen lamp, a laser oscillator, an electron beam accelerator, a hot plate, a Peltier element, a magnetron, a filament, a heater, or the like can be used. However, the present invention is not limited to these. If an electromagnetic wave is used as the energy 20a for first material molding, the first material molding mechanism 3 can include a mechanism that supplies the electromagnetic wave to the first material 13a from above the substrate 11b with the first material 13a in the bathtub portion 10a directly or via an optical system such as a lens. On the other hand, if heat is used as the energy 20a for first material molding, the first material molding mechanism 3 can include a mechanism that supplies heat to the first material 13a via the substrate 11b from below the substrate 11b or directly from above the substrate 11b.

Here, in the first material molding mechanism 3, the first substrate holding unit 12a of the first material supply mechanism 2 may be used as a substrate holding unit that fixes/holds the substrate 11b to which the energy 20a is supplied from the first energy source 15a. In this case, the first substrate holding unit 12a can be controlled by the control unit 7 such that it moves to the first material molding mechanism 3 after the first material 13a is supplied into the bathtub portion 10a by the first material supply unit 14a of the first material supply mechanism 2. Note that in the first material molding mechanism 3, instead of commonly using the first substrate holding unit 12a of the first material supply mechanism 2, as described above, a substrate holding unit different from the first substrate holding unit 12a of the first material supply mechanism 2 may be provided.

Figure 4C:
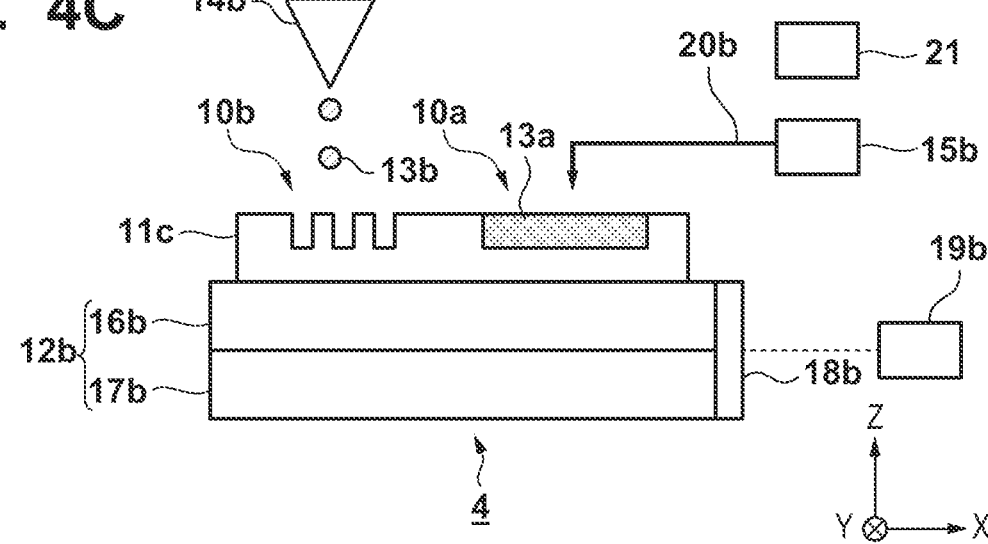
FIG. 4C is a schematic view showing an example of the configuration of the thin film forming mechanism of the film forming apparatus according to the present invention.

The thin film forming mechanism 4 is a mechanism that forms a thin film (planarization film) on a substrate 11c after the first material 13a supplied into the bathtub portion 10a by the first material supply mechanism 2 is molded by the first material molding mechanism 3. The thin film forming mechanism 4 forms a thin film (planarization film) on a target region of the substrate 11c including the bathtub portion 10a (first concave portion) and the plurality of grooves 10b (second concave portions). For example, the thin film forming mechanism 4 supplies a second material 13b onto the target region and molds the second material 13b such that the plurality of grooves 10b are filled with the second material 13b and the thin film (planarization film) of the second material 13b is formed over all of the target region. The thin film forming mechanism 4 can include, for example, a second substrate holding unit 12b capable of fixing/holding the substrate 11c and moving it, and a second material supply unit 14b that supplies the second material 13b onto the substrate 11c, as shown in FIG. 4C. In addition, the thin film forming mechanism 4 can include a thin film molding driving unit 21 configured to mold the second material 13b into a thin film and a second energy source 15b that supplies, to the second material 13b, energy 20b for solidifying the second material 13b into a solid thin film.

The second substrate holding unit 12b can include a substrate chuck 16b that fixes/holds the substrate 11c with the solidified first material 13a in the bathtub portion 10a. The second substrate holding unit 12b can also include a substrate driving mechanism 17b that controls the position of the substrate 11c concerning at least two axes in the x-axis direction and the y-axis direction on the XYZ coordinate system. Also, the second substrate holding unit 12b may include, on its side surfaces, a plurality of reference mirrors 18b corresponding to X, Y, Z, ωx, ωy, and ωz directions. In this case, the thin film forming mechanism 4 includes a plurality of laser interferometers 19b (length measurement devices) that irradiate the reference mirrors 18b with beams, thereby measuring the position of the second substrate holding unit 12b (that is, the position of the substrate 11c). The laser interferometers 19b measure the position of the second substrate holding unit 12b, and the control unit 7 executes positioning control of the substrate 11c (second substrate holding unit 12b) based on measurement values at this time. The thin film forming mechanism 4 may measure the position of the second substrate holding unit 12b using an encoder in place of the reference mirrors 18b and the laser interferometers 19b. This makes it possible to align the substrate 11c with other portions and, for example, improve the alignment accuracy between the substrate 11c and the second material supply unit 14b and supply the second material 13b to a desired position in accordance with the pattern layout of the fine pattern portions on the substrate 11c. The second substrate holding unit 12b may be the same as the first substrate holding unit 12a or may serve as that.

The second material supply unit 14b is a unit configured to supply the second material 13b onto the substrate 11c with the solidified first material 13a in the bathtub portion 10a. For example, if the second material 13b is a liquid, the second material supply unit 14b can supply the second material 13b onto the substrate 11c using arbitrary methods to be described below. Example of the arbitrary methods are an inkjet method, a dip-coating method, an air knife coating method, a curtain coating method, a wire-bar coating method, a gravure coating method, an extrusion coating method, a spin coating method, a slit scanning method, and a spray coating method. In the present invention, it is preferable to supply the second material 13b as a film onto the substrate by the spin coating method. Alternatively, it is particularly preferable to supply the second material 13b onto the substrate as a droplet or in an island or film shape formed by connecting a plurality of droplets using a dispenser including one or a plurality of nozzles. In this case, the second material supply unit 14b is preferably a jetting nozzle or dispenser including a nozzle capable of supplying a droplet of a volume on a sub-femto liter or picoliter order. Also, the second material supply unit 14b can preferably supply the second material 13b onto the substrate 11c such that the volume per substrate area becomes uniform and/or the volume changes over all of the substrate surface in accordance with the surface shape of the substrate 11c. Furthermore, the second material supply unit 14b is preferably configured such that the material supply amount per unit time becomes larger than that of the first material supply unit 14a.

Here, the second material 13b supplied onto the substrate by the second material supply unit 14b is not limited to a liquid if it is a material that the thin film forming mechanism 4 can mold. An appropriate second material supply unit 14b can be provided in the thin film forming mechanism 4 in accordance with the state of the substance of the second material 13b. Also, the second material supply unit 14b may include a driving mechanism that controls the position of the second material supply unit 14b concerning at least two axes in the x-axis direction and the y-axis direction on the XYZ coordinate system. The second material supply unit 14b may be the same as the first material supply unit 14a or may serve as that. Note that in the present invention, the second material supply unit 14b suitable for a spin coating method, a superstrate contact separating method, an SST-NIL spread method, a heat imprinting method, an optical imprinting method, or the like is particularly preferably provided in the thin film forming mechanism 4.

The thin film molding driving unit 21 is a driving unit configured to form a thin film of the second material 13b supplied onto the substrate 11$c$ by the second material supply unit 14$b$. The thin film molding driving unit 21 may be understood as a processing unit that performs processing for molding the second material 13$b$ supplied onto the substrate 11$c$ by the second material supply unit 14$b$ into a thin film. Thus, a substrate 11$d$ on which the thin film of the second material 13$b$ is formed can be obtained. The thin film molding driving unit 21 can be a driving unit capable of forming a thin film whose average film thickness is 0.1 nm (inclusive) to 1,000 nm (inclusive), although it changes depending on the application purpose. The thin film molding driving unit 21 can be a driving unit capable of forming a thin film whose average film thickness is preferably 1 nm (inclusive) to 50 nm (inclusive) and, more preferably, 1 nm (inclusive) to 10 nm (inclusive).

The thin film molding driving unit 21 can include a driving unit configured to mold a thin film using arbitrary methods to be described below. Examples of the arbitrary methods are an inkjet method, a dip-coating method, an air knife coating method, a curtain coating method, a wire-bar coating method, a gravure coating method, an extrusion coating method, a spin coating method, a slit scanning method, and a spray coating method. Alternatively, the thin film molding driving unit 21 can include a driving unit configured to mold, into a thin film, the second material 13$b$ supplied onto the substrate as a droplet or in an island or film shape formed by connecting a plurality of droplets using a dispenser including one or a plurality of nozzles. Furthermore, the thin film molding driving unit 21 can include a driving unit configured to mold a thin film by a chemical vapor deposition (CVD) method, an atomic layer deposition (ALD) method, a metalorganic chemical vapor deposition (MOCVD) method, an MOVPE method, a physical vapor deposition method, or the like. In the present invention, as the thin film molding driving unit 21, a driving unit suitable for forming a thin film by a spin coating method, a super-strate contact separating method, an SST-NIL spread method, a heat imprinting method, an optical imprinting method, or the like is particularly preferably provided.

The second energy source 15$b$ can supply, to the second material 13$b$, the energy 20$b$ for molding (for example, solidifying) the second material 13$b$ on the substrate 11$d$. As the second energy source 15$b$, an electromagnetic wave source, a heat source, or the like can be used. That is, an electromagnetic wave, heat, or the like can be used as the energy 20$b$. The electromagnetic wave is, for example, light such as a microwave, infrared rays, visible rays, or ultraviolet rays whose wavelength is selected from the range of 10 nm (inclusive) to 1 mm (inclusive). As the electromagnetic wave, radiation such as an electron beam or gamma rays can also be employed. As the second energy source 15$b$, for example, a high-pressure mercury lamp, a xenon lamp, a halogen lamp, a laser oscillator, an electron beam accelerator, a hot plate, a Peltier element, a magnetron, a filament, a heater, or the like can be used. However, the present invention is not limited to these. If an electromagnetic wave is used as the energy 20$b$ for second material molding (thin film molding), the thin film forming mechanism 4 can include a mechanism that supplies the electromagnetic wave to the second material 13$b$ from above the substrate 11$d$ directly or via an optical system such as a lens. On the other hand, if heat is used as the energy 20$b$ for second material molding, the thin film forming mechanism 4 can include a mechanism that supplies heat to the second material 13$b$ via the substrate from below the substrate 11$d$ or directly from above the substrate 11$d$. The second energy source 15$b$ may be the same as the first energy source 15$a$ or may serve as that.

The film forming apparatus 1 according to this embodiment can operate based on input of the bathtub information 5. The bathtub information 5 is information about the bathtub portion 10$a$, and can include data (bathtub data 24) of the bathtub portion 10$a$ concerning, for example, the coordinates (position) based on a reference point as a reference on the substrate, the capacity, the width diameter, the depth, the shape, and the like. For example, the film forming apparatus 1 can use the bathtub information 5 based on the bathtub data 24 measured by a surface roughness meter, a surface shape measurement device, an AFM, an SEM, a shape analysis laser microscope, a laser displacement gauge, or the like. Also, instead of directly performing the measurement inside the apparatus, the film forming apparatus 1 may use the bathtub information 5 based on the bathtub data 24 converted from another data by calculation or the like.

The bathtub information 5 may be the bathtub data 24 obtained by measurement outside the apparatus, or may be the bathtub data 24 obtained by measurement inside the apparatus. The bathtub information 5 is preferably bathtub data 24 measured inside the apparatus. If the bathtub data 24 measured inside the apparatus is used as the bathtub information 5, the film forming apparatus 1 can include, inside the apparatus, a measurement mechanism 6 that is a means for measuring the surface shape of the substrate. As the measurement mechanism 6, the film forming apparatus 1 can include a bathtub data measurement unit 25 that measure data serving as the base of the bathtub information 5, for example, a surface roughness meter, a surface shape measurement device, an AFM, an SEM, a shape analysis laser microscope, or a laser displacement gauge. In addition, the film forming apparatus 1 can include a bathtub data processing unit 26 configured to convert, as needed, data measured by the measurement mechanism 6 into the bathtub information 5 that can be input to the film forming apparatus 1. The bathtub data processing unit 26 may be provided inside the film forming apparatus 1, or may be installed in a place different from the film forming apparatus 1 to perform processing remotely.

Also, the film forming apparatus 1 can include a high-temperature processing unit 9, a substrate conveyance unit 8, and the control unit 7. The high-temperature processing unit 9 can heat the substrate 11$e$ with a solid thin film 27 of the second material 13$b$ formed by the thin film forming mechanism 4 and/or the thin film on the substrate to a high temperature. As the energy source of the high-temperature processing unit 9, an electromagnetic wave source, a heat source, or the like can be used. That is, an electromagnetic wave, heat, or the like can be used as the energy for high-temperature processing. The electromagnetic wave is, for example, light such as a microwave, infrared rays, visible rays, or ultraviolet rays whose wavelength is selected from the range of 10 nm (inclusive) to 1 mm (inclusive). As the electromagnetic wave, radiation such as an electron beam or gamma rays can also be employed. As the energy source of the high-temperature processing unit 9, for example, a magnetron, a hot plate, a Peltier element, a thermostat chamber, a high-pressure mercury lamp, a laser oscillator, an electron beam accelerator, or the like can be used. However, the present invention is not limited to these. If an electromagnetic wave is used as the energy for high-temperature processing, the energy source of the high-temperature processing unit 9 can include a mechanism that supplies the electromagnetic wave to the second material 13b from above the substrate 11e directly or via an optical system such as a lens. On the other hand, if heat is used as the energy for high-temperature processing, the energy source of the high-temperature processing unit 9 can include a mechanism that supplies heat to the second material 13b via the substrate from below the substrate 11e.

The high-temperature processing unit 9 can preferably heat the substrate and/or the thin film on the substrate to a predetermined temperature of 100° C. (inclusive) to 500° C. (inclusive) and more preferably to a predetermined temperature of 200° C. (inclusive) to 450° C. (inclusive). The high-temperature processing unit 9 can also have a function of setting a constant temperature step and/or a temperature raising/lowering step. For example, the high-temperature processing unit 9 may be a heating device such as a hot plate, a Peltier element, a thermostat chamber, or an oven, or a magnetron. The energy source of the high-temperature processing unit 9 may be the same as the first energy source 15a and/or the second energy source 15b or may serve as that.

The substrate conveyance unit 8 can take a substrate 11 from the outside of the film forming apparatus 1 into the film forming apparatus 1 and convey it to the substrate holding unit 12a and/or 12b. The substrate conveyance unit 8 can also convey the substrate 11 after film formation from the substrate holding unit 12a and/or 12b to the outside of the film forming apparatus 1. If the mechanisms/units of the film forming apparatus 1 are not shared but separately installed, the substrate 11 can be conveyed between the mechanisms/units.

To form a film on the substrate (pattern substrate) with the bathtub portion 10a, the control unit 7 controls the operations of the mechanisms/units of the film forming apparatus 1. That is, the control unit 7 can be configured to control the mechanisms/units of the film forming apparatus 1, such as the first material supply mechanism 2, the first material molding mechanism 3, and the thin film forming mechanism 4. The control unit 7 may be provided inside the film forming apparatus 1, or may be installed in a place different from the film forming apparatus 1 to perform control remotely.

Second Embodiment

[Film Forming Method]

In the second embodiment, a film forming method according to the present invention will be described. The film forming method according to this embodiment is a method for forming a film on a substrate and is more specifically a method of accurately forming a thin film (planarization film) on a substrate whose surface shape has variations. For example, the substrate as the target to form a thin film has a region including a plurality of concave portions. Of the plurality of concave portions, at least one concave portion (first concave portion) is sometimes formed as a bathtub portion whose width is larger than another concave portion (second concave portion). The film forming method according to this embodiment is a method for accurately forming a thin film (planarization film) over all of the region of the substrate including the plurality of concave portions. The film forming method according to this embodiment can include, for example, a step of supplying a first material into a bathtub portion (first concave portion), a step of molding the first material, a step of supplying a second material onto the substrate, and a step of molding the second material. The step of molding the second material may be understood as a step of forming a thin film (planarization film) of the second material on the substrate.

The film forming method according to this embodiment will exemplarily be described below with reference to FIG. 5. FIG. 5 is a flowchart showing the film forming method according to this embodiment in which a film is formed on the target region of a substrate. The target region is a region of a substrate where a bathtub portion 10a (first concave portion) and a plurality of grooves 10b (second concave portions) are formed. As an example, the plurality of grooves 10b can be formed as lines and spaces with a fine pitch.

In step S101, a substrate 11a is carried into a film forming apparatus 1. For example, the substrate 11a can be carried to a substrate chuck 16a of a first substrate holding unit 12a using a substrate conveyance unit 8. The substrate 11a can have a surface shape derived from a substrate processing step before the step to apply the present invention. The surface shape of the substrate 11a has variations depending on the position on the substrate and includes a plurality of concave portions. At least one of the concave portions is the bathtub portion 10a. As for the surface shape of the substrate 11a, the edge of each concave portion may have a rectangular shape, or may have a smooth curved surface without a rectangular shape.

The bathtub portion 10a included in the uneven pattern of the substrate 11a is a concave portion whose width and/or capacity is larger than the remaining concave portions (the plurality of grooves 10b) on the same substrate. The width diameter of the bathtub portion 10a can be 0.3 µm or more. The film forming method according to this embodiment is particularly effective when the width diameter of the bathtub portion 10a is 1 µm or more. If the width diameter of the bathtub portion 10a is 5 µm or more, the advantage can be conspicuous as compared to conventional film forming techniques. The capacity of the bathtub portion 10a can be 0.1 fL or more. The film forming method according to this embodiment is particularly effective when the capacity of the bathtub portion 10a is 1 fL m or more. If the capacity of the bathtub portion 10a is 1.5 fL or more, the advantage can be conspicuous as compared to conventional film forming techniques. The sectional shape of the bathtub portion 10a can be set to a rectangular recess, a moderately curved recess, or another arbitrary shape. The shape of the bathtub portion 10a viewed from above the substrate can be set to a square shape, a rectangular shape, a triangular shape, a parallelogram shape, a trapezoidal shape, a circular shape, an elliptical shape, an L shape, or another arbitrary shape. Here, the height difference of the surface shape of the substrate 11a is, for example, about 1 nm to 1 mm, preferably, about 1 nm to 10,000 nm. In a region where the fine uneven pattern includes the plurality of grooves 10b (second concave portions), the height difference of the surface shape is preferably set to about 10 nm to 200 nm.

As the substrate 11a, a silicon wafer is typically used. However, the present invention is not limited to this. The substrate 11a can arbitrarily be selected from semiconductor device substrates of aluminum, a titanium-tungsten alloy, an aluminum-silicon alloy, an aluminum-copper-silicon alloy, silicon oxide, silicon nitride, and the like silica, glass, ceramic, a metal, a semiconductor, and a resin. A material different from the substrate 11a may be formed or stacked on the surface as needed. In addition, a plurality of materials may be formed or stacked. Note that the substrate 11a or the uppermost surface of the substrate 11a to be used may undergo a surface treatment such as a silane coupling treatment, a silazane treatment, or formation of an organic thin film to improve the adhesion to a first material 13*a* and a second material 13*b*.

In step S102, the first material 13*a* is selectively supplied into the bathtub portion 10*a* of the substrate 11*a*. In this step, for example, the first material 13*a* can be supplied into the bathtub portion 10*a* using a first material supply unit 14*a* described in the first embodiment. Thus, a substrate 11*b* in which the first material 13*a* is supplied into the bathtub portion 10*a* can be obtained.

Here, in step S102, the first material 13*a* can be supplied as one or a plurality of droplets into the bathtub portion 10*a*. At this time, each droplet preferably has a volume smaller than the capacity of the bathtub portion 10*a* such that each droplet of the first material 13*a* is fitted in the bathtub portion 10*a*. For example, the volume of each droplet can be 2 pL or less. In addition, each droplet preferably has a diameter smaller than the width diameter of the bathtub portion 10*a* such that each droplet of the first material 13*a* is fitted in the bathtub portion 10. For example, the width diameter (for example, the width diameter at the time of landing on the substrate) of each droplet can be 8 μm or less.

Also, in step S102, the first material 13*a* may selectively be supplied into the bathtub portion 10*a* based on information about at least one of the position and the capacity of the bathtub portion 10*a*. More specifically, the first material 13*a* may selectively be supplied into the bathtub portion 10*a* of the substrate 11*a* based on bathtub information 5 including bathtub data such as the coordinates based on a reference point as a reference on the substrate, the capacity, the width diameter, the depth, the shape, and the like. This makes it possible to appropriately set the volume of the first material 13*a* to be supplied to the bathtub portion 10*a* based on the information about the capacity, the width diameter, the depth, and the like of the bathtub portion 10*a*. It is also possible to appropriately set the position of the bathtub portion 10*a* to which the first material 13*a* should be supplied based on the information about the coordinates, the shape, and the like of the bathtub portion 10*a*. That is, when supply of the first material 13*a* to the bathtub portion 10*a* is controlled based on the bathtub information 5, an appropriate amount of first material 13*a* can be supplied into the bathtub portion 10*a* while targeting the inside of the bathtub portion 10*a*.

In general, when a material reacts (changes its state), the volume of the material often changes. In the first material 13*a* used in this embodiment as well, when the first material 13*a* is molded (solidified) in step S103 to be described later, a volume change may occur in the first material 13*a* before and after the molding. For this reason, in step S102, it is preferable to supply an appropriate volume of first material 13*a* into the bathtub portion 10*a* in anticipation of the degree of volume change. For example, a liquid material such as a curable composition that can be used as the first material 13*a* often causes curing shrinkage when performing a reaction (state change) such as curing (solidification). The typical curing shrinkage ratio is about 5% to 15%. In this case, in step S102, it is preferable to supply an appropriate volume of first material 13*a* into the bathtub portion 10*a* in anticipation of the degree of volume decrease that may occur when curing (solidifying) and molding the curable composition that is the first material 13*a* in step S103 to be described later. As an example, the first material 13*a* of an amount larger than the capacity of the bathtub portion 10*a* is preferably supplied into the bathtub portion 10*a* such that the volume of the first material 13*a* after molding becomes close to the capacity of the bathtub portion 10*a*. As the first material 13*a*, a liquid material that causes a volume increase (curing expansion) when performing a reaction (state change) such as curing (solidification), reverse to the above-described curing shrinkage material, may be used. Note that it is particularly preferable to use, as the first material 13*a*, a material with little curing shrinkage or curing expansion or without curing shrinkage or curing expansion. In this case, it may be easy or unnecessary to anticipate the degree of volume change before and after molding.

The volume decrease of the first material 13*a* can also depend on the volatility of the first material 13*a*, time from supply of the first material 13*a* onto the substrate 11*a* to curing, the process temperature, and the like. In step S102, it is preferable to supply an appropriate volume of first material 13*a* into the bathtub portion 10*a* in anticipation of the degree of volume decrease. Also, it is particularly preferable to use a material with little volatility or without volatility as the first material 13*a*. In this case, it may be easy or unnecessary to anticipate the degree of volume change before and after molding.

It is relatively difficult to comprehensively anticipate the degree of volume change of the first material 13*a* in consideration of all factors associated with the volume change (volume decrease or volume increase) of the first material 13*a*. For this reason, it is particularly preferable to feed back a result of attempting the step of supplying the first material 13*a* into the bathtub portion 10*a* and molding and supply an appropriate volume of first material 13*a* into the bathtub portion 10*a*. For example, it is preferable to feed back the result and decide the appropriate volume of the first material 13*a* to be supplied into the bathtub portion 10*a* such that the volume of the first material 13*a* after molding becomes close to the capacity of the bathtub portion 10*a*. In a case where a plurality of bathtub portions 10*a* are formed in one substrate 11*a*, the first material 13*a* may sequentially be supplied to each bathtub portion 10*a* of the substrate 11*a* one by one, or the first material 13*a* may be supplied to the plurality of bathtub portions 10*a* of the substrate 11*a* at once.

As the first material 13*a*, a curable composition (also called a resin in an uncured state) that is cured by energy 20*a* given by the first material molding mechanism 3 (first energy source 15*a*) can be used. The curable composition can be a composition that is cured by irradiation of an electromagnetic wave such as light or heating. A photo-curable composition that is cured by light contains at least a polymerizable compound and a photopolymerization initiator, and may further contain a nonpolymerizable compound or a solvent, as needed. Here, the polymerizable compound is a compound that reacts with a polymerizing factor (a radical, an ion, or the like) generated from the photopolymerization initiator and forms a solid made of a polymer compound by a chain reaction (polymerization reaction). An example of the polymerizable compound is a radical polymerizable compound. If the radical polymerizable compound is formed by a plurality of types of compounds including one or more acryloyl groups or methacryloyl groups, it preferably contains a monofunctional acrylic monomer and a polyfunctional acrylic monomer.

The photo-curable composition may be made of one type of polymerizable compound, or may be made of a plurality of types of polymerizable compounds. The photopolymerization initiator is a compound that senses light of a predetermined wavelength and generates the above-described polymerizing factor (radical). More specifically, the photo-polymerization initiator is a polymerization initiator (radical generator) that generates a radical by light (infrared rays, visible rays, ultraviolet rays, far ultraviolet rays, X-rays, a charged particle beam such as an electron beam, radiation). The photo-curable composition may be made of one type of photopolymerization initiator, or may be made of a plurality of types of photopolymerization initiators. The nonpolymerizable compound is at least one material selected from the group consisting of a sensitizer, a hydrogen donor, an internal mold release agent, a surfactant, an antioxidant, and a polymer component.

Of the curable compositions, a heat-curable composition that is cured by heat contains at least a polymerizable compound and a heat polymerization initiator, and may further contain a nonpolymerizable compound or a solvent, as needed. Here, the polymerizable compound is a compound that reacts with a polymerizing factor (a radical, an ion, or the like) generated from the heat polymerization initiator and forms a solid made of a polymer compound by a chain reaction (polymerization reaction). An example of the polymerizable compound is a radical polymerizable compound. If the radical polymerizable compound is formed by a plurality of types of compounds including one or more acryloyl groups or methacryloyl groups, it preferably contains a monofunctional acrylic monomer and a polyfunctional acrylic monomer.

Here, as the typical examples of the first material 13a, liquid curable compositions that are cured and changed to a solid when the first material molding mechanism 3 supplies light or heat as the energy 20a have been exemplified. However, the first material 13a is not limited to the liquid curable compositions if it is a material that can be molded by the first material molding mechanism 3. For example, a solid such as a thermoplastic resin, a metal, an alloy, or a semiconductor or a gas such as a vapor or a reactive gas may be used as the first material 13a. If the first material 13a is a solid, it can be heated so as to be suppled as a liquid or a gas and returned to the solid by cooling to be molded. It is more preferable that the first material is supplied as a solution, returned to the solid by removing the solvent by heating or decompression, and then molded.

In step S103, the first material 13a supplied into the bathtub portion 10a in step S102 is molded. In this step, for example, the first material 13a in the bathtub portion 10a can be molded using the first material molding mechanism 3 described in the first embodiment. Molding in this step can include solidifying the first material 13a by the energy 20a supplied from the first energy source 15a in addition to making the shape of the first material 13a supplied into the bathtub portion 10a to a desired shape. Thus, a substrate 11c with the solidified and molded first material 13a in the bathtub portion 10a can be obtained. In a case where a plurality of bathtub portions 10a are formed in one substrate 11b, the energy 20a may sequentially be supplied to each bathtub portion 10a of the substrate 11b one by one, or the energy 20a may be supplied to the plurality of bathtub portions 10a of the substrate 11b at once.

The thickness of the first material 13a molded in the bathtub portion 10a in this step preferably falls within the range of ±20% the depth of the bathtub portion 10a. The thickness of the first material 13a more preferably falls within the range of ±10% the depth of the bathtub portion 10a, and more preferably falls within the range of ±5% the depth of the bathtub portion 10a. This can improve the planarity of a thin film formed in a subsequent step. Also, the surface of the first material 13a molded in the bathtub portion 10a in this step is preferably higher than the height of the edge of the bathtub portion 10a. This can further improve the planarity of a thin film formed on the substrate by canceling (reducing) the unevenness of the first material 13a by the second material 13b supplied in a subsequent step.

In step S104, the second material 13b is supplied onto the substrate 11c with the solidified first material 13a in the bathtub portion 10a. More specifically, in this step, the second material 13b is supplied onto the target region of the substrate 11c, which includes the bathtub portion 10a (with the solidified first material 13a inside) and the plurality of grooves 10b. In this step, for example, the second material 13b can be supplied onto the target region using the thin film forming mechanism 4 (a second substrate holding unit 12b and/or a second material supply unit 14b) described in the first embodiment.

Here, in step S104, the second material 13b can be supplied onto the target region such that the plurality of grooves 10b (second concave portions) are filled with the second material 13b, and a planarization film of the second material 13b is formed over all of the target region. For example, in this step, the second material 13b of a volume calculated from the area of the target region and a desired average film thickness can be supplied such that a solid thin film (planarization film) of the second material 13b molded in next step S105 has a desired average film thickness. The second material 13b is preferably supplied onto the substrate 11c (onto the target region) such that the volume per substrate area becomes uniform.

Also, in step S104 as well, as in step S102, the degree of volume change is preferably comprehensively anticipated in consideration of the whole volume change (volume decreases or volume increases) of the material. However, this is relatively difficult. For this reason, it is particularly preferable to feed back a result of attempting the step of forming a solid thin film of the second material 13b on the substrate with the solidified and molded first material 13a in the bathtub portion 10a and supply an appropriate volume of second material 13b onto the substrate (onto the target region). Furthermore, it is preferable to use a material with little curing change or without curing change and/or a material with low volatility or without volatility. This may make it easy or unnecessary to anticipate the degree of volume change. In turn, it may be easy to form, on the substrate, a thin film with little film thickness unevenness, that is, little surface roughness.

Also, in step S104, the second material 13b is preferably supplied onto the target region such that the surface of the thin film of the second material 13b molded in step S105 later becomes higher than the surface of the first material 13a molded in the bathtub portion 10a. This can further improve the planarity of the thin film formed on the substrate by canceling (reducing) the unevenness of the first material 13a by the second material 13b.

As the second material 13b, a curable composition (also called a resin in an uncured state) that is cured by energy 20b given by the thin film forming mechanism 4 (second energy source 15b) can be used. The curable composition can be a composition that is cured by irradiation of an electromagnetic wave such as light or heating. A photo-curable composition that is cured by light contains at least a polymerizable compound and a photopolymerization initiator, and may further contain a nonpolymerizable compound or a solvent, as needed. Here, the polymerizable compound is a compound that reacts with a polymerizing factor (a radical, an ion, or the like) generated from the photopolymerization initiator and forms a solid made of a polymer compound by a chain reaction (polymerization reaction). An example of the polymerizable compound is a radical polymerizable compound. If the radical polymerizable compound is formed by a plurality of types of compounds including one or more acryloyl groups or methacryloyl groups, it preferably contains a monofunctional acrylic monomer and a polyfunctional acrylic monomer.

The photo-curable composition may be made of one type of polymerizable compound, or may be made of a plurality of types of polymerizable compounds. The photopolymerization initiator is a compound that senses light of a predetermined wavelength and generates the above-described polymerizing factor (radical). More specifically, the photopolymerization initiator is a polymerization initiator (radical generator) that generates a radical by light (infrared rays, visible rays, ultraviolet rays, far ultraviolet rays, X-rays, a charged particle beam such as an electron beam, radiation). The photo-curable composition may be made of one type of photopolymerization initiator, or may be made of a plurality of types of photopolymerization initiators. The nonpolymerizable compound is at least one material selected from the group consisting of a sensitizer, a hydrogen donor, an internal mold release agent, a surfactant, an antioxidant, and a polymer component.

Of the curable compositions, a heat-curable composition that is cured by heat contains at least a polymerizable compound and a heat polymerization initiator, and may further contain a nonpolymerizable compound or a solvent, as needed. Here, the polymerizable compound is a compound that reacts with a polymerizing factor (a radical, an ion, or the like) generated from the heat polymerization initiator and forms a solid made of a polymer compound by a chain reaction (polymerization reaction). An example of the polymerizable compound is a radical polymerizable compound. If the radical polymerizable compound is formed by a plurality of types of compounds including one or more acryloyl groups or methacryloyl groups, it preferably contains a monofunctional acrylic monomer and a polyfunctional acrylic monomer.

As the curable composition of the second material 13b, a curable composition different from the curable composition of the first material 13a may be used. However, a curable composition that is similar or identical to the curable composition of the first material 13a is preferably used. This is because the process can be easy in post-processing such as etching.

Also, as another second material 13b, a solution of a polymer, an oligomer, a siloxane, a silsesquioxane, or the like can be used. Such a material is particularly preferable when forming a thin film by a solution application method such as spin-coating. As such a material, for example, an SOC (Spin-On-Carbon) material, an SOG (Spin-On-Glass) material, or the like can be used.

Here, as the typical examples of the second material 13b, liquids and solutions that are cured and changed to a solid when the thin film forming mechanism 4 supplies light or heat as the energy 20b have been exemplified. However, the second material 13b is not limited to the liquids and the solutions if it is a material capable of forming a thin film on the substrate 11c with the solidified first material 13a in the bathtub portion 10a. For example, a solid such as a thermoplastic resin, a metal, an alloy, or a semiconductor or a gas such as a vapor or a reactive gas may be used as the second material 13b. If the second material 13b is a solid, it can be heated so as to be suppled as a liquid or a gas and returned to the solid by cooling to form a thin film. Note that the second material 13b may be a material different from the first material 13a, or may be the same as the first material 13a or may serve as that.

In step S105, a solid thin film 27 (planarization film) of the second material 13b supplied onto the substrate 11c (onto the target region) in step S104 is formed. That is, the second material 13b is molded into a thin film, and the second material 13b is solidified by the energy 20b supplied from the second energy source 15b to form the solid thin film 27. It may be understood that molding the second material 13b includes solidifying the second material 13b by the energy 20b. In this step, for example, the second material 13b on the target region can be molded using the thin film forming mechanism 4 (the second material supply unit 14b and/or a thin film molding driving unit 21) described in the first embodiment.

The average film thickness of the solid thin film 27 can be 0.1 nm (inclusive) to 1,000 nm (inclusive), although it changes depending on the application purpose. The average film thickness is preferably 0.1 nm (inclusive) to 50 nm (inclusive) and more preferably 0.11 nm (inclusive) to 10 nm (inclusive). If the average film thickness is small, post-processing such as CMP or etch back of the solid thin film 27 may be completed in a short time or may be unnecessary. In turn, this leads to improvement of productivity or reduction of manufacturing cost. Also, the surface roughness ($3\sigma$) of the solid thin film 27 can be 20 nm or less. The surface roughness is preferably 10 nm or less and more preferably 4 nm or less. If the surface roughness is small, various kinds of improvements can be made in accordance with the type of lithography to be executed after film formation such that, for example, the pattern accuracy of a transfer pattern can be improved in NIL (nanoimprint lithography).

In step S105, the solid thin film 27 of the second material 13b is preferably formed by a spin coating method, a superstrate contact separating method, an SST-NIL spread method, a heat imprinting method, an optical imprinting method, or the like.

In step S106, a substrate 11e on which the solid thin film 27 of the second material 13b is formed in step S105 is carried out from the film forming apparatus 1. In this step, for example, the substrate 11e can be carried out from a substrate chuck 16b of the second substrate holding unit 12b using the substrate conveyance unit 8.

Third Embodiment

Figure 6:
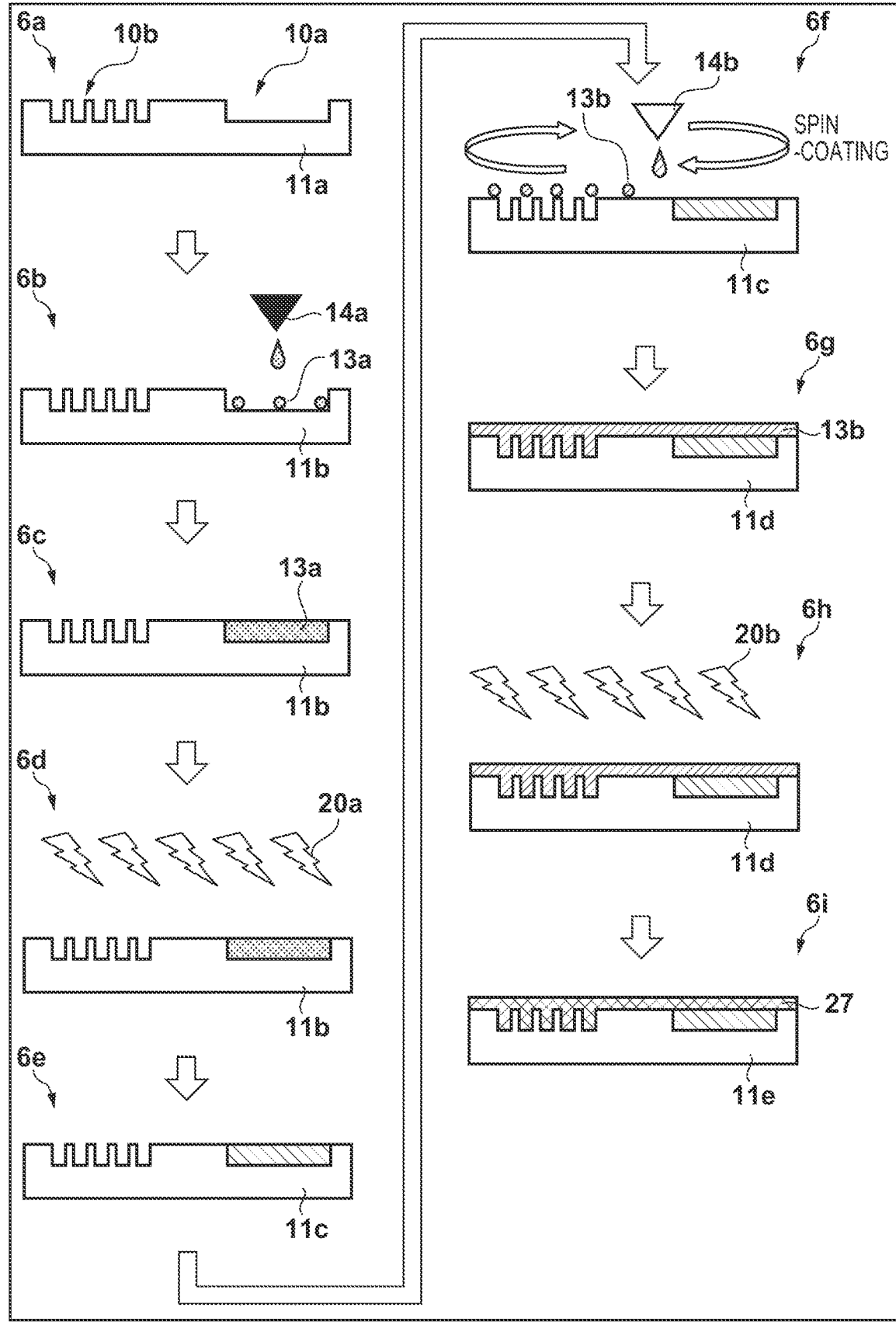
FIG. 6 is a view showing a detailed example of the film forming method according to the present invention.

In the third embodiment, a detailed example of the above-described film forming method (second embodiment) will be described in detail with reference to FIG. 6. Here, a description will be made in accordance with the flowchart of the film forming method shown in FIG. 5. In this embodiment, a photo-curable composition is used as a first material 13a, a high-pressure mercury lamp is used as a first energy source 15a, and ultraviolet rays are used as energy 20a supplied from the first energy source 15a. In addition, a photo-curable composition is used as a second material 13b, a high-pressure mercury lamp is used as a second energy source 15b, and ultraviolet rays are used as energy 20b supplied from the second energy source 15b. As a thin film forming mechanism 4, an apparatus (also called a spin coater) capable of executing a spin-coating method and including a second material supply unit 14b and a thin film molding driving unit 21 is employed.

In step S101, a substrate 11a having a surface shape derived from a substrate processing step before application of the film forming method according to the present invention is carried into a film forming apparatus 1. The surface shape of the substrate 11a has variations depending on the position on the substrate, as indicated by 6a in FIG. 6, and can include a plurality of concave portions in a target region where a thin film (planarization film) is to be formed. The plurality of concave portions can include a bathtub portion 10a (first concave portion) that forms a trench region, and a plurality of grooves 10b (second concave portions) that form a dense region. An example in which as for the surface shape of the substrate 11a, the edge of each concave portion has a rectangular shape, the height difference of unevenness (the depth of each concave portion) is 50 nm, the width of each groove 10b is 20 nm, the width of the bathtub portion 10a is 10 μm, and the capacity of the bathtub portion 10a is 5 fL will be described here. However, the present invention is not limited to this. Pieces of bathtub information 5 are measured in advance, and the first material 13a is supplied based on the input of the bathtub information 5.

In step S102, the first material 13a is selectively supplied into the bathtub portion 10a of the substrate 11a. For example, as indicated by 6b in FIG. 6, using a first material supply unit 14a capable of supplying a droplet of a volume of 0.1 fL per unit, 50 droplets of the first material 13a each having a volume of 0.1 fL are supplied into the bathtub portion 10a on the substrate 11a. A substrate 11b can thus be obtained. Next, in step S103, the first material 13a supplied into the bathtub portion 10a in step S102 is molded. In this embodiment, as indicated by 6c in FIG. 6, processing waits until the first material 13a supplied into the bathtub portion 10a spreads inside the bathtub portion 10a and fills the bathtub portion 10a (up to each corner). Then, as indicated by 6d in FIG. 6, the first material 13a in the bathtub portion 10a is irradiated with the energy 20a from the first energy source 15a. Thus, as indicated by 6e in FIG. 6, a substrate 11c with the solidified and molded first material 13a in the bathtub portion 10a can be obtained.

In steps S104 and S105, the second material 13b is suppled onto the substrate 11c (onto the target region) and molded such that each of the plurality of grooves 10b is filled with the second material 13b, and a solid thin film (planarization film) of the second material 13b is formed over all of the target region. In this embodiment, the solid thin film of the second material 13b is formed on the substrate 11c (on the target region) using a spin-coating method. More specifically, as indicated by 6f in FIG. 6, while the substrate 11c is rotated, the second material 13b is supplied onto the substrate 11c (onto the target region) by a second material supply unit 14b. Thus, as indicated by 6g in FIG. 6, a substrate 11d with the thin film of the second material 13b can be obtained. Then, as indicated by 6h in FIG. 6, the thin film of the second material 13b formed on the substrate 11d is irradiated with the energy 20b from the second energy source 15b, thereby solidifying (curing) the second material 13b. Thus, as indicated by 6i in FIG. 6, a substrate 11e with a solid thin film 27 of the second material 13b over all of the target region can be obtained. That is, it is possible to obtain the substrate 11e that includes the first material 13a in the bathtub portion 10a, the second material 13b in each groove 10b, and the solid thin film 27 (planarization film) of the second material 13b over all of the target region.

In step S106, the substrate 11e including the solid thin film 27 of the second material 13b is carried out from the film forming apparatus 1.

Fourth Embodiment

In the fourth embodiment, another detailed example of the above-described film forming method will be described. This embodiment basically takes over the third embodiment.

The same processing as in the third embodiment can be performed except that in steps S102 and S103, a heat-curable composition is used as a first material 13a, a hot plate is used as a first energy source 15a, and heat is used as energy 20a from the first energy source 15a. Except these, the same processing as in the third embodiment can be performed.

Fifth Embodiment

In the fifth embodiment, still another detailed example of the above-described film forming method will be described. This embodiment basically takes over the third embodiment. In steps S102 and S103, a thermoplastic resin is used as a first material 13a, a hot plate is used as a first energy source 15a, and heat is used as energy 20a from the first energy source 15a. Except these, the same processing as in the third embodiment can be performed. Note that the thermoplastic resin may be supplied as a solution of the thermoplastic resin, and solvent removal and molding may simultaneously be executed using heat.

Sixth Embodiment

In the sixth embodiment, still another detailed example of the above-described film forming method will be described. This embodiment basically takes over the third to fifth embodiments. In steps S104 and S105, a heat-curable composition is used as a second material 13b, a hot plate is used as a second energy source 15b, and heat is used as energy 20b from the second energy source 15b. Except these, the same processing as in one of the third to fifth embodiments can be performed.

Seventh Embodiment

In the seventh embodiment, still another detailed example of the above-described film forming method will be described. This embodiment basically takes over the third to fifth embodiments. In steps S104 and S105, a thermoplastic resin is used as a second material 13b, a hot plate is used as a second energy source 15b, and heat is used as energy 20b from the second energy source 15b. Except these, the same processing as in one of the third to fifth embodiments can be performed. Note that the thermoplastic resin may be supplied as a solution of the thermoplastic resin, and solvent removal and molding may simultaneously be executed using spin-coating and/or heat.

Eighth Embodiment

In the eighth embodiment, still another detailed example of the above-described film forming method will be described. This embodiment basically takes over the third to fifth embodiments. In steps S104 and S105, an SOC material is used as a second material 13b, a hot plate is used as a second energy source 15b, and heat is used as energy 20b from the second energy source 15b. Except these, the same processing as in one of the third to fifth embodiments can be performed. Note that the SOC material may be supplied as a solution of the SOC material, and solvent removal and molding may simultaneously be executed using spin-coating and/or heat.

Ninth Embodiment

In the ninth embodiment, still another detailed example of the above-described film forming method will be described.

This embodiment basically takes over the third to fifth embodiments. In steps S104 and S105, an SOG material is used as a second material 13b, a hot plate is used as a second energy source 15b, and heat is used as energy 20b from the second energy source 15b. Except these, the same processing as in one of the third to fifth embodiments can be performed. Note that the SOG material may be supplied as a solution of the SOG material, and solvent removal and molding may simultaneously be executed using spin-coating and/or heat.

10th Embodiment

In the 10th embodiment, still another detailed example of the above-described film forming method will be described. This embodiment basically takes over the third to fifth embodiments. In steps S104 and S105, when forming a solid thin film on a substrate (on a target region), a superstrate contact separating method is used. Except this, the same processing as in one of the third to fifth embodiments can be performed. Here, the superstrate contact separating method is a substrate planarization method in which a superstrate (planar template) having a flat surface is pressed against a liquid material and separated after curing. For example, a substrate planarization method disclosed in U.S. Pat. Nos. 9,415,418, 8,394,282, or the like can be employed. In this embodiment, a flattening processing (planarization) method of pressing a planar template (mold) against an uncured resist (a curable composition or an uncured resin) supplied (applied) in advance onto a substrate and performing local planarization in the substrate plane is applied to a part of the present invention.

Figure 7:
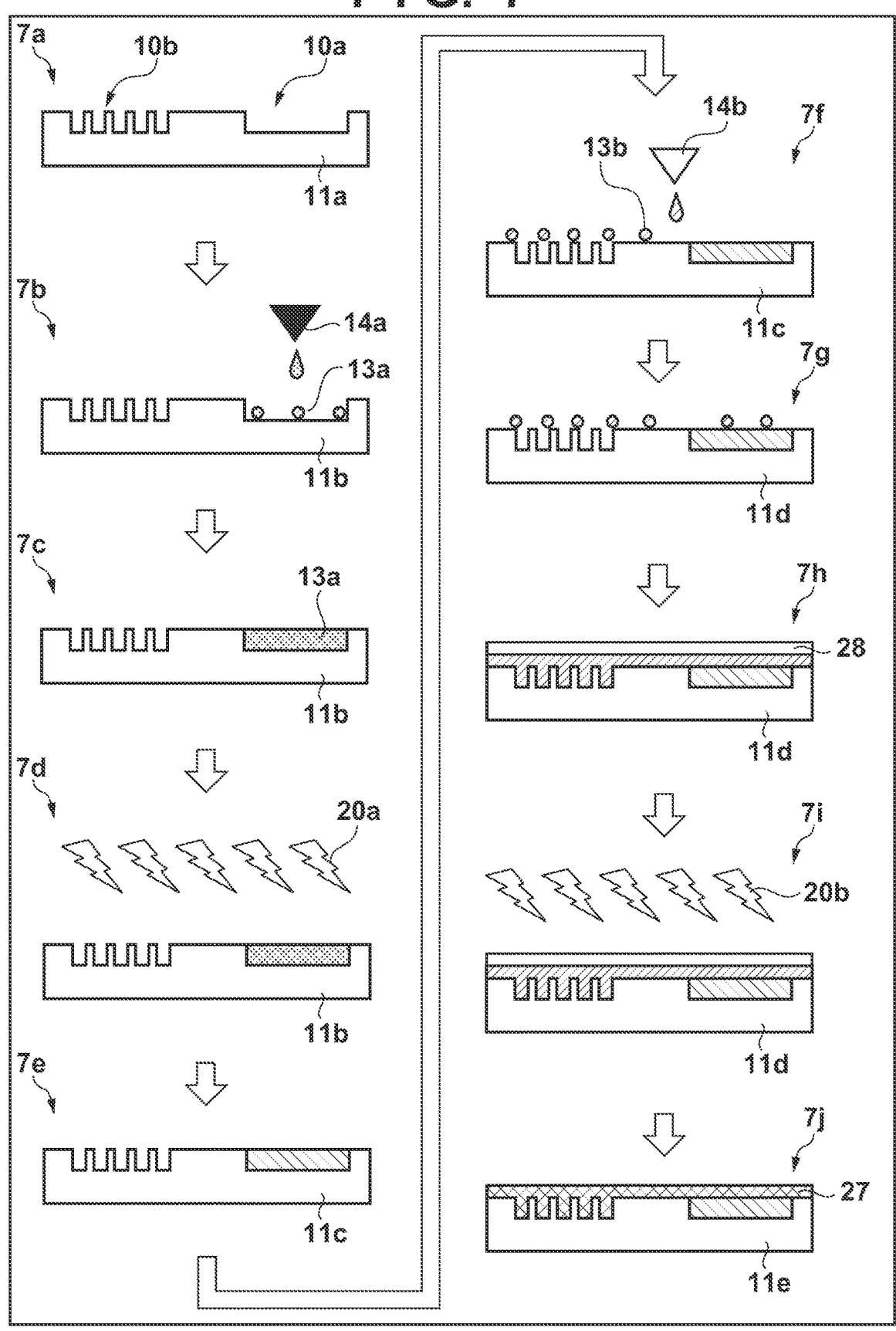
FIG. 7 is a view showing a detailed example of the film forming method according to the present invention.

The detailed example of the film forming method according to this embodiment will be described in detail with reference to FIG. 7. Here, a description will be made in accordance with the flowchart of the film forming method shown in FIG. 5. Also, in steps S101 to S103 and S106, the same processing as in one of the third to fifth embodiments is performed, and a description thereof will be omitted here. For example, 7a to 7e in FIG. 7 are the same as 6a to 6e in FIG. 6.

In step S104, a second material 13b is supplied onto a substrate 11c (onto a target region). In this embodiment, as indicated by 7f in FIG. 7, using a second material supply unit 14b capable of supplying a droplet of a volume of 1 pL per unit, a droplet of the second material 13b having a volume of 1 pL is supplied onto the substrate 11c as a droplet or in an island or film shape formed by connecting a plurality of droplets. Thus, as indicated by 7g in FIG. 7, a substrate 11d with the second material 13b supplied as a plurality of droplets onto the target region can be obtained.

In step S105, the second material 13b supplied onto the substrate 11d (onto the target region) is molded. In this embodiment, as indicated by 7h in FIG. 7, a superstrate 28 is brought into contact with the second material 13b supplied onto the substrate 11d (onto the target region), and processing waits until each of a plurality of grooves 10b is filled with the second material 13b, and the second material 13b spreads over all of the target region. Then, as indicated by 7i in FIG. 7, in the state in which the second material 13b and the superstrate 28 are in contact, the second material 13b is irradiated with energy 20b from a second energy source 15b via the superstrate 28, thereby solidifying (curing) the second material 13b. In addition, the superstrate 28 is separated from the solidified second material 13b. Thus, as indicated by 7j in FIG. 7, a substrate 11e with a solid thin film 27 of the second material 13b over all of the target region can be obtained.

The superstrate 28 used in this embodiment is preferably a member (for example, a silica substrate) having such a size that it can contact the whole surface of a substrate 11a with a bathtub portion 10a. For example, if the substrate 11a is a wafer with a diameter Φ of 300 mm, a silica substrate with a diameter Φ of 300 mm, a 300-mm square silica substrate, or a silica substrate with a diameter Φ of 450 mm, which are planarized and have a small surface roughness, can be used as the superstrate 28.

11th Embodiment

In the 11th embodiment, still another detailed example of the above-described film forming method will be described. This embodiment basically takes over the third to fifth embodiments. In step S104 and/or step S105, when forming a solid thin film on a substrate (on a target region), an optical imprinting method is used. Except this, the same processing as in one of the third to fifth embodiments can be performed.

As an apparatus for forming a thin film by the optical imprinting method, for example, an optical imprinting apparatus such as a nanoimprint semiconductor manufacturing apparatus available from Canon or a mass production mask replica manufacturing apparatus can be used. At this time, a second material 13b supplied onto a substrate (onto a target region) is preferably imprinted using a flat superstrate (planar template) without a pattern. For example, if a substrate 11a is a wafer with a diameter Φ of 300 mm, a silica substrate with a diameter Φ of 300 mm, a 300-mm square silica substrate, or a silica substrate with a diameter Φ of 450 mm, which are planarized and have a small surface roughness, can be used as the superstrate. If the substrate 11a is a replica template, a planarized silica template with a small surface roughness can be used as the superstrate.

In particular, when manufacturing a replica template, that is, a child mold or a grandchild mold duplicated from a master template (master mold) for nanoimprint lithography (NIL), this embodiment is preferably employed. That is, in FIG. 7, a film is formed on a substrate 11 for a replica template using not a superstrate contact separating method but a mass production mask replica manufacturing apparatus and a blank template without an uneven pattern.

12th Embodiment

In the 12th embodiment, still another detailed example of the above-described film forming method will be described. This embodiment basically takes over the third to fifth embodiments. In step S104 and/or step S105, when forming a solid thin film on a substrate (on a target region), a heat imprinting method is used. Except this, the same processing as in one of the third to fifth embodiments can be performed. In this embodiment, preferably, a thermoplastic resin is used as a second material 13b, a hot plate is used as a second energy source 15b, and heat is used as energy 20b from the second energy source 15b. The thermoplastic resin may be supplied as a solution of the thermoplastic resin, and solvent removal and molding may simultaneously be executed using spin-coating and/or heat.

13th Embodiment

In the 13th embodiment, still another detailed example of the above-described film forming method will be described.

This embodiment basically takes over the third to fifth embodiments. In step S104 and/or step S105, when forming a solid thin film on a substrate (on a target region), an SST spread method is used in place of the spin-coating method. Except this, the same processing as in one of the third to fifth embodiments can be performed.

Here, the SST spread method is a method of discretely applying, on a layer made of a liquid film of a curable composition ($\alpha$1) on a substrate, droplets of a curable composition ($\alpha$2) having interface energy smaller than that of the curable composition ($\alpha$1). In this method, the droplets quickly spread in a wide range by the Marangoni effect, and a liquid film of a mixture of the curable composition ($\alpha$1) and the curable composition ($\alpha$2) can be formed. For example, a curable composition spread method that is a part of SST-NIL disclosed in Japanese Patent No. 6141500 can be employed. In this embodiment, the SST-NIL spread method is applied to a part of the present invention.

The detailed example of the film forming method according to this embodiment will be described in detail. Here, a description will be made in accordance with the flowchart of the film forming method shown in FIG. 5. Also, in steps S101 to S103 and S106, the same processing as in one of the third to fifth embodiments is performed, and a description thereof will be omitted here.

In step S104, a curable composition ($\alpha$1) is supplied onto a substrate 11c (onto a target region) by a spin-coating method to form a liquid film, and droplets of a curable composition ($\alpha$2) having interface energy smaller that of the curable composition ($\alpha$1) are discretely supplied onto the liquid film. In this embodiment, the curable composition ($\alpha$1) and curable composition ($\alpha$2) are used as a second material 13b. Next, in step S105, a thin film formed when the curable composition ($\alpha$2) on a substrate 11d spreads in a wide range while mixing with the curable composition ($\alpha$1) is irradiated with energy 20b from a second energy source 15b. Thus, a substrate 11e with a solid thin film 27 of the second material 13b as the mixture of the curable composition ($\alpha$1) and the curable composition ($\alpha$2) can be obtained.

14th Embodiment

In the 14th embodiment, still another detailed example of the above-described film forming method will be described. This embodiment basically takes over the 13th embodiment. In step S105, a superstrate is brought into contact with a curable composition ($\alpha$1) and a curable composition ($\alpha$2) on a substrate 11d to form a thin film, and the thin film is irradiated with energy 20b. Thus, a solid thin film 27 of a second material 13b is formed on the substrate. Except this, the same processing as in the 13th embodiment can be performed. Here, for example, if a substrate 11a is a wafer with a diameter $\Phi$ of 300 mm, a silica substrate with a diameter $\Phi$ of 300 mm, a 300-mm square silica substrate, or a silica substrate with a diameter $\Phi$ of 450 mm, which are planarized and have a small surface roughness, can be used as the superstrate. If the substrate 11a is a replica template, a planarized silica template with a small surface roughness can be used as the superstrate.

15th Embodiment

Figure 8:
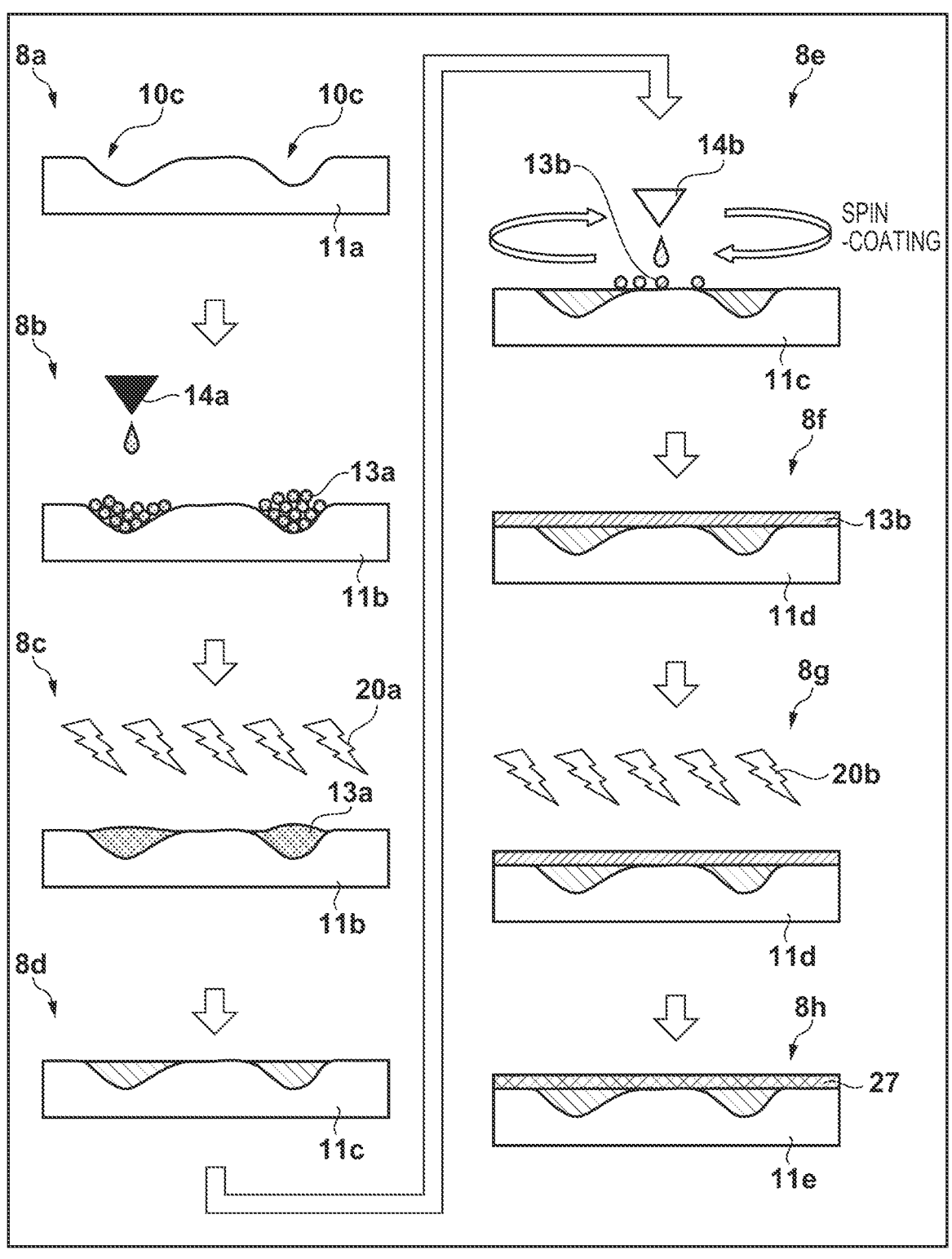
FIG. 8 is a view showing a detailed example of the film forming method according to the present invention.

In the 15th embodiment, a detailed example of the above-described film forming method will be described with reference to FIG. 8. In this embodiment, as indicated by 8a in FIG. 8, a substrate 11a that includes a moderately curved recess 10c as a first concave portion in a target region is used. Also, it can be understood that the substrate 11a includes a recess (a groove, a step difference, or a surface roughness) with a capacity smaller than the recess 10c as a second concave portion in the target region. In this embodiment, a solid thin film can be formed on the substrate by performing the same processing as in one of the third to 14th embodiments.

The detailed example of the film forming method according to this embodiment will be described in detail with reference to FIG. 8. Here, a description will be made in accordance with the flowchart of the film forming method shown in FIG. 5. Also, in steps S101 and S106, the same processing as in one of the third to 14th embodiments is performed, and a description thereof will be omitted here. Here, an example in which a solid thin film is formed on a substrate by performing the same processing as in the third embodiment will be described below. However, the present invention is not limited to this, and a solid thin film may be formed on a substrate by performing the same processing as in one of the fourth to 14th embodiments.

In steps S102 and S103, a first material 13a is selectively supplied into the recesses 10c (first concave portions) of the substrate 11a, and the first material 13a is molded. In this embodiment, as indicated by 8b in FIG. 8, the first material 13a is selectively supplied as a plurality of droplets to the recesses 10c of the substrate 11a by a first material supply unit 14a. Thus, a substrate 11b can be obtained. Next, processing waits until the first material 13a supplied into the recesses 10c spreads inside the recesses 10c and fills the recesses 10c (up to each corner). Then, as indicated by 8c in FIG. 8, the first material 13a in the recesses 10c is irradiated with energy 20a from a first energy source 15a. Thus, as indicated by 8d in FIG. 8, a substrate 11c with the solidified and molded first material 13a in the recesses 10c can be obtained.

In steps S104 and S105, a second material 13b is suppled onto the substrate 11c (onto the target region) and molded such that each recess as a second concave portion is filled with the second material 13b, and a solid thin film (planarization film) of the second material 13b is formed over all of the target region. In this embodiment, the solid thin film of the second material 13b is formed on the substrate 11c (on the target region) using a spin-coating method. More specifically, as indicated by 8e in FIG. 8, while the substrate 11c is rotated, the second material 13b is supplied onto the substrate 11c (onto the target region) by a second material supply unit 14b. Thus, as indicated by 8f in FIG. 8, a substrate 11d with the thin film of the second material 13b can be obtained. Then, as indicated by 8g in FIG. 8, the thin film of the second material 13b formed on the substrate 11d is irradiated with energy 20b from a second energy source 15b, thereby solidifying (curing) the second material 13b. Thus, as indicated by 8h in FIG. 8, a substrate 11e with a solid thin film 27 of the second material 13b over all of the target region can be obtained.

16th Embodiment

In the 16th embodiment, still another detailed example of the above-described film forming method will be described. This embodiment basically takes over the third to 15th embodiments. A heating step is added between step S105 and step S106. Except this, the same processing as in one of the third to 15th embodiments can be performed. The heating step is a step of heating a substrate 11e on which a solid thin film is formed in steps S102 to S105 and/or the solid thin film on the substrate to a high temperature by a high-temperature processing unit 9. In the heating step, baking is preferably performed at, for example, 200° C. for 30 min, although the process changes depending on the material used in the substrate 11*e*.

17th Embodiment

In the 17th embodiment, still another detailed example of the above-described film forming method will be described. This embodiment basically takes over the third to 16th embodiments. A measurement step of measuring the surface shape of a substrate and/or a molded product in each step is added. The measurement step is a step of measuring, by a measurement mechanism 6, the surface shape of a substrate 11*a*, the surface shape of a first material 13*a* molded in a bathtub portion 10*a*, and/or the surface shape of a solid thin film of a second material 13*b* formed on a target region. Except this, the same processing as in one of the third to 16th embodiments can be performed.

Figure 9:
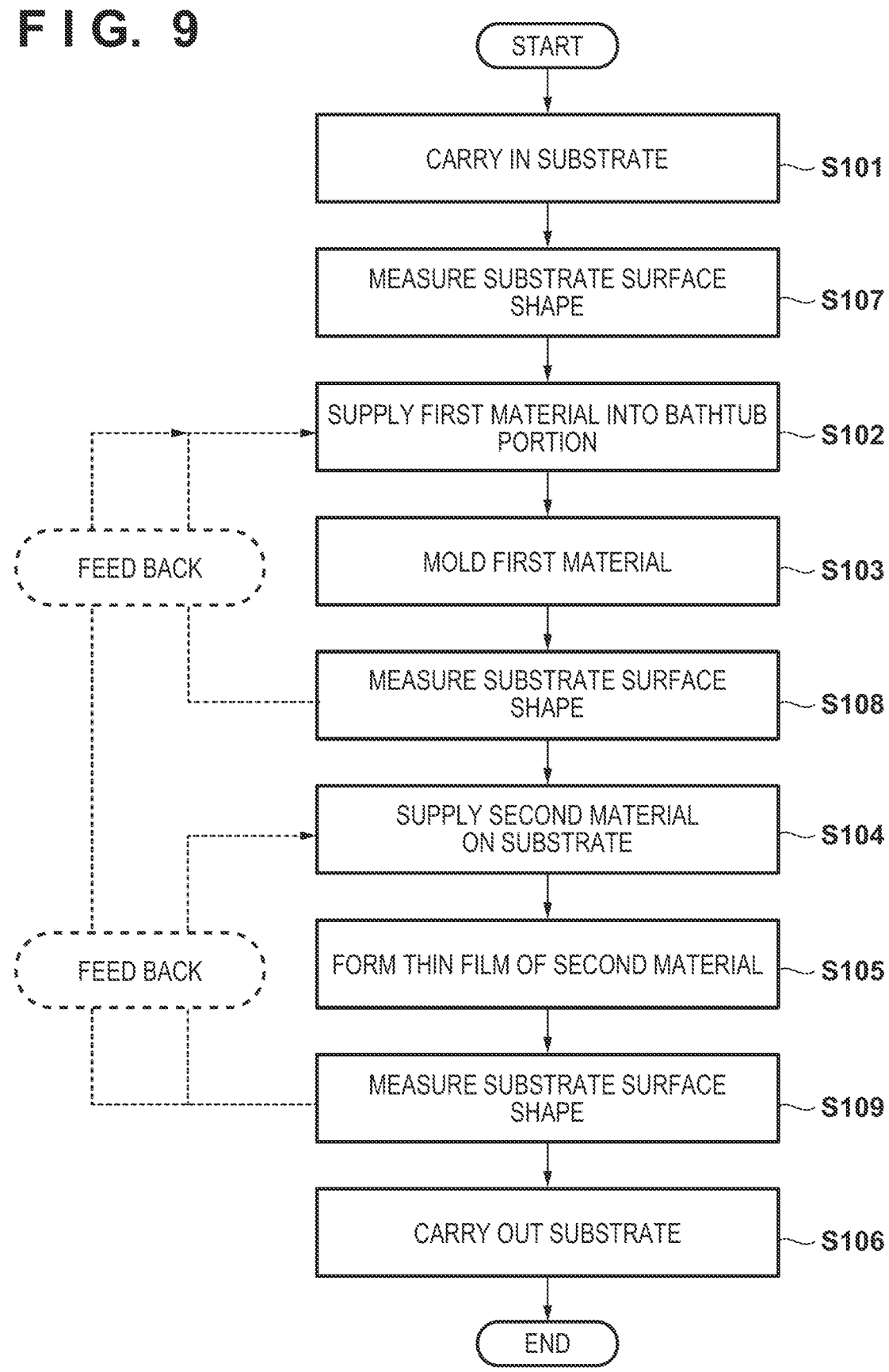
FIG. 9 is a flowchart showing a modification of the film forming method according to the present invention.

FIG. 9 shows a flowchart of the film forming method according to this embodiment. Steps S101 to S106 in FIG. 9 are the same as steps S101 to S106 in FIG. 5, and a description thereof will be omitted here.

Step S107 is a step of measuring the surface shape of the substrate 11*a* carried into the apparatus in step S101, and can be executed between step S101 and step S102. In step S107, for example, the measurement mechanism 6 measures at least one of the coordinates (position), the capacity, the width diameter, the depth, and the shape of the bathtub portion 10*a* on the substrate 11*a* as bathtub information 5 (bathtub data 24). Based on the measurement result in step S107, a control unit 7 can decide the volume to the first material 13*a* to be selectively supplied into the bathtub portion 10*a*. In step S102, the first material 13*a* can selectively be supplied into the bathtub portion 10*a* by a first material supply unit 14*a* based on the decided volume of the first material 13*a* and the measured position of the bathtub portion 10*a*.

Step S108 is a step of measuring the surface shape of the first material 13*a* selectively supplied into the bathtub portion 10*a* and molded in steps S102 and S103, and can be executed between step S103 and step S104. In step S108, for example, the measurement mechanism 6 measures the thickness and/or the surface roughness of the first material 13*a* molded in the bathtub portion 10*a*. Based on the measurement result in step S108, the control unit 7 feeds back the result to next step S102 such that the surface shape (the thickness and/or the surface roughness) of the first material 13*a* to be molded in the bathtub portion 10*a* in the next target region falls within an allowable range. For example, based on the measurement result in step S108, the control unit 7 can decide the supply amount of the first material 13*a* applied to step S102 to be performed for the next target region (that is, the volume of the first material 13*a* to be supplied into the bathtub portion 10*a*). Since, in the next target region, the first material 13*a* can be molded into a desired thickness and/or shape in the bathtub portion 10*a*, a solid thin film 27 of the second material 13*b*, which is flatter, that is, has a smaller surface roughness, can be formed on the substrate.

Note that in step S107 and/or step S108, the surface shape of the substrate 11*a* can be measured in step S107, and the surface shape of a substrate 11*c* with the solidified first material 13*a* in the bathtub portion 10*a* can be measured in step S108. It can then be determined whether it is the bathtub portion (first concave portion), fine uneven pattern portions (a plurality of grooves) (second concave portions), or a region other than these. Furthermore, at least one of the coordinates (position), the capacity, the width diameter, the depth, and the shape of the fine uneven pattern portions (the plurality of grooves) (second concave portions) or the region other than these can be measured. Then, the volume of the second material 13*b* to be supplied to each of the fine uneven pattern portions (the plurality of grooves) (second concave portions) and the region other than these can be decided. In step S104, based on the decided volume of the second material 13*b* and the measured position of each of the fine uneven pattern portions (the plurality of grooves) (second concave portions) 10*b* and the region other than these, the second material 13*b* can be supplied such that it has a volume distribution according to each portion of the target region. The second material 13*b* can be supplied by a second material supply unit 14*b*.

Step S109 is a step of measuring the surface shape of the solid thin film (planarization film) of the second material 13*b* formed on the target region in steps S104 and S105, and can be executed between step S105 and step S106. In step S109, for example, the measurement mechanism 6 measures the thickness (film thickness) and/or the surface roughness of the solid thin film 27 of the second material 13*b* formed on the target region. Based on the measurement result in step S109, the control unit 7 feeds back the result to next step S102 and/or next step S104 such that the surface shape (the thickness and/or the surface roughness) of the solid thin film 27 of the second material 13*b* to be formed on the next target region falls within an allowable range. For example, based on the measurement result in step S109, the control unit 7 can decide the supply amount of the first material 13*a* applied to step S102 to be performed for the next target region. In addition, based on the measurement result in step S109, the control unit 7 can decide the supply amount of the second material 13*b* applied to step S104 to be performed for the next target region (that is, the volume of the second material 13*b* to be supplied onto the target region). Hence, in the next target region, the solid thin film 27 of the second material 13*b*, which is flatter, that is, has a smaller surface roughness, can be formed on the substrate.

Embodiment of Article Manufacturing Method

The present invention can also be applied to manufacturing of an article. An embodiment of article manufacturing to which the present invention is applied will be described.

An article manufacturing method according to an embodiment of the present invention is suitable for manufacturing an article such as a microdevice such as a semiconductor device or an element having a microstructure. The article manufacturing method according to the embodiment includes a formation step of forming a film on a substrate using the above-described film forming method, and a processing step of processing the substrate on which the film is formed in the formation step. Furthermore, the manufacturing method includes other well-known steps (oxidization, deposition, vapor deposition, doping, planarization, etching, resist removal, dicing, bonding, packaging, and the like). The article manufacturing method according to this embodiment is superior to a conventional method in at least one of the performance, quality, productivity, and production cost of an article.

The processing step of processing the substrate on which the film is formed can include a step of forming a pattern on the film (for example, a cured product of a curable composition) on the substrate using various kinds of lithography apparatuses. The pattern of the cured product of the curable composition formed using various kinds of lithography apparatuses is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the optical element are a diffraction grating and a polarizing plate. An example of the mold is an imprint mold (replica mold).

The pattern of the cured product is directly used as at least some of the constituent members of the above-described articles or used temporarily as a resist mask. After etching or ion implantation is performed in the substrate processing step, the resist mask is removed.

A detailed method of manufacturing an article will be described next. A description will be made here using an example of an article manufacturing method using an imprint apparatus. However, the present invention is not limited to this. Various kinds of lithography apparatuses may be used.

Figure 10:
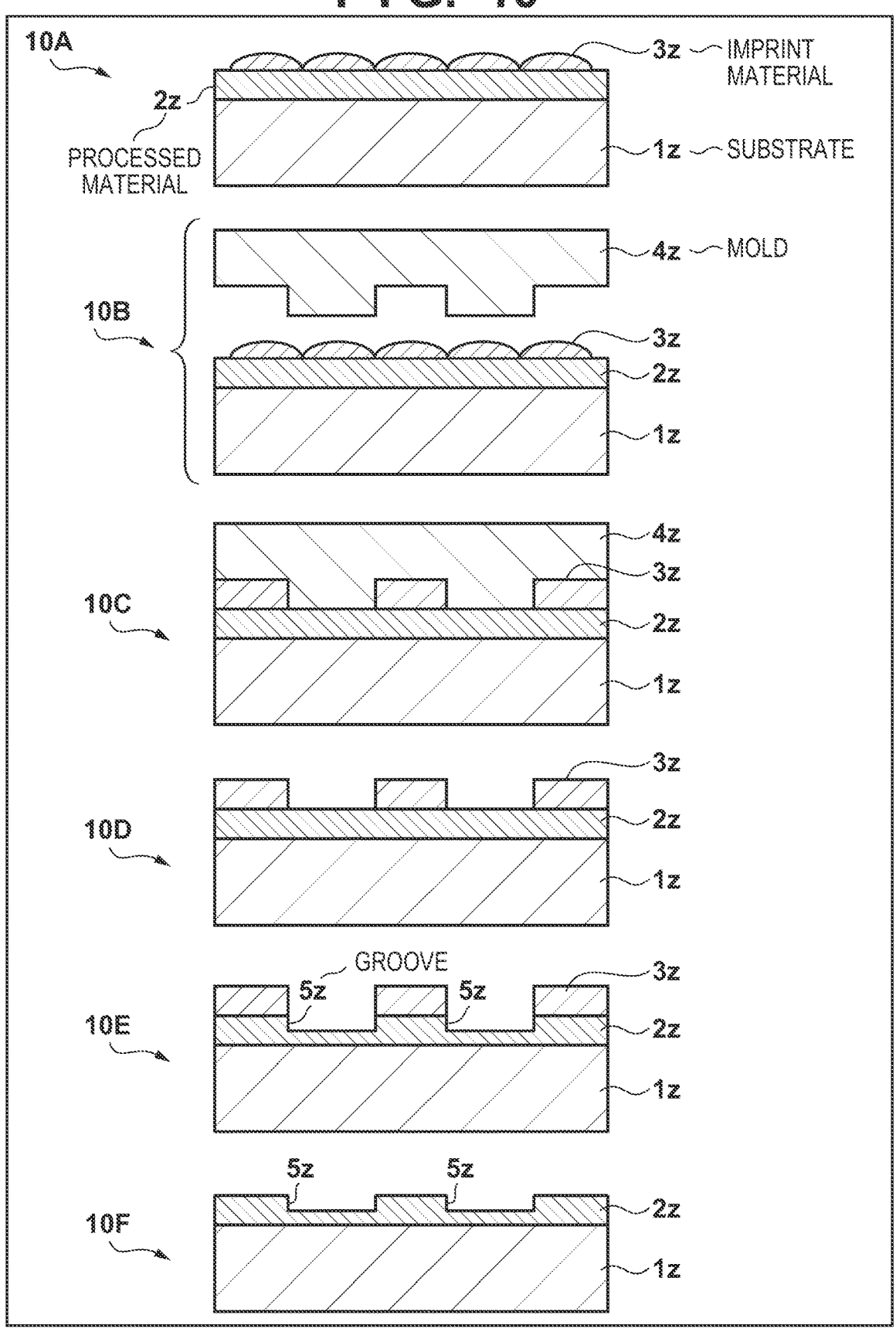
FIG. 10 is a view for explaining an article manufacturing method.

As indicated by 10A in FIG. 10, a substrate 1z such as a silicon wafer on which a solid thin film (planarization film) is formed by the film forming apparatus and/or the film forming method according to the present invention and a processed material 2z such as an insulator is formed on the solid thin film is prepared. Next, a curable composition 3z (for example, an imprint material) is applied to the surface of the processed material 2z by an inkjet method or the like. A state in which the curable composition 3z is supplied as a plurality of droplets onto the substrate is shown here.

As indicated by 10B in FIG. 10, a side of a mold 4z for imprint with an uneven pattern is directed toward and made to face the curable composition 3z on the substrate. As indicated by 10C in FIG. 10, the substrate 1z to which the curable composition 3z is supplied is brought into contact with the mold 4z, and a pressure is applied. The gap between the mold 4z and the processed material 2z is filled with the curable composition 3z. In this state, when the curable composition 3z is irradiated with light as energy for curing via the mold 4z, the curable composition 3z is cured.

As indicated by 10D in FIG. 10, after the curable composition 3z is cured, the mold 4z is separated from the substrate 1z, and the pattern of the cured product of the curable composition 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the curable composition 3z.

As indicated by 10E in FIG. 10, when etching is performed using the pattern of the cured product as an etching resistant mask, a portion of the surface of the processed material 2z where the cured product does not exist or remains thin is removed to form a groove 5z. Note that it is also preferable to remove the remaining portion in advance using etching of a type different from that etching. As indicated by 10F in FIG. 10, when the pattern of the cured product is removed, an article with the grooves 5z formed in the surface of the processed material 2z can be obtained. For example, if a silicon wafer is used as the substrate 1z, an electric circuit element such as a semiconductor element, a MEMS, a recording element, a sensor, or the like can be obtained as an article. If silica is used as the substrate 1z, a replica mold, an optical element, or the like can be obtained as an article. Here, the pattern of the cured product is removed. However, instead of removing the pattern of the cured product after the process, it may be used as, for example, an interlayer dielectric film included in a semiconductor element or the like or a pattern structure of an optical material for forming an optical element, that is, a constituent member of an article.

As described above, the film forming apparatus and/or the film forming method according to the present invention can also be applied to the embodiment of article manufacturing. When a substrate on which a solid thin film (planarization film) is formed in accordance with one of the above-described first to 17th embodiments is used, an article with high performance can be manufactured.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A film forming method of forming a film on a substrate, wherein
the substrate includes a region including a first concave portion and a second concave portion, and
the first concave portion has a width larger than that of the second concave portion,
the film forming method comprising:
selectively supplying a first material into the first concave portion and curing the first material; and
supplying a second material onto the region including the first concave portion and the second concave portion and curing the second material, such that the second concave portion is filled with the second material and a planarization film of the second material is formed over all of the region, each of the first material and the second material containing a polymerizable compound and a polymerization initiator and being a curable composition whose volume changes by being cured, and in the selectively supplying, the first material is supplied into the first concave portion at an amount such that a height of a surface of the cured first material is higher than a height of an edge of the first concave portion.

2. The film forming method according to claim 1, wherein the first material is selectively supplied into the first concave portion based on information about at least one of a position and a capacity of the first concave portion.

3. The film forming method according to claim 2, further comprising:

obtaining the information by measuring at least one of the position and the capacity of the first concave portion, before the first material is selectively supplied into the first concave portion.

4. The film forming method according to claim 1, wherein the first material is supplied into the first concave portion at the amount such that a thickness of the cured first material exceeds a depth of the first concave portion by not more than 20%.

5. The film forming method according to claim 1, wherein the first material is a material whose volume becomes smaller after being cured than before being cured, and the supplied amount of the first material is larger than a capacity of the first concave portion.

6. The film forming method according to claim 1, wherein curing the first material includes solidifying the first material supplied into the first concave portion.

7. The film forming method according to claim 1, wherein the first material is cured by waiting until the first concave portion is filled with the first material.

8. The film forming method according to claim 1, wherein a capacity of the first concave portion is larger than a capacity of the second concave portion.

9. The film forming method according to claim 1, wherein each of the first concave portion and the second concave portion includes at least one edge with a rectangular shape.

10. The film forming method according to claim 1, wherein the first material is supplied as a droplet into the first concave portion, and the droplet has a width diameter smaller than a width diameter of the first concave portion and/or a volume smaller than a capacity of the first concave portion.

11. The film forming method according to claim 10, wherein the droplet has a width diameter of not more than 8 $\mu$m and/or a volume of 2 pL.

12. The film forming method according to claim 1, wherein the first concave portion has a width diameter of not less than 0.3 $\mu$m and/or a capacity of the first concave portion is not less than 0.1 fL.

13. The film forming method according to claim 1, wherein based on a surface shape of the cured first material, a supply amount of the first material applied next is decided such that the surface shape of the first material to be cured next falls within an allowable range.

14. The film forming method according to claim 1, wherein the second material is supplied onto the region such that a surface of the planarization film of the second material is higher than a surface of the cured first material in the first concave portion.

15. The film forming method according to claim 1, wherein based on a surface shape of the cured second material, a supply amount of the second material to be applied next is decided such that the surface shape of the second material to be cured next falls within an allowable range.

16. The film forming method according to claim 1, wherein the planarization film of the second material whose average film thickness falls within a range of not less than 0.1 nm to not more than 1,000 nm is formed on the region.

17. The film forming method according to claim 1, wherein the planarization film of the second material whose surface roughness is not more than 20 nm is formed on the region.

18. The film forming method according to claim 1, wherein the planarization film of the second material is formed on the region using at least one of a spin coating method, a superstrate contact separating method, an SST-NIL spread method, a heat imprinting method, and an optical imprinting method.

19. An article manufacturing method comprising:

forming a film on a substrate using a film forming method defined in claim 1; and processing the substrate on which the film has been formed, wherein an article is manufactured from the processed substrate.

* * * * *